United States Patent [19]

Hayashi

[11] Patent Number: 5,030,541

[45] Date of Patent: Jul. 9, 1991

[54] IMAGE-FORMING METHOD USING A LIGHT-SENSITIVE MATERIAL

[75] Inventor: Hiroshi Hayashi, Kanagawa, Japan

[73] Assignee: Fuji Photo Film Co., Ltd., Kanagawa, Japan

[21] Appl. No.: 402,365

[22] Filed: Sep. 5, 1989

[30] Foreign Application Priority Data

Sep. 5, 1988 [JP] Japan ................... 63-221640

[51] Int. Cl.$^5$ ................ G03C 1/38; G03C 8/00
[52] U.S. Cl. .................... 430/138; 430/203; 430/253; 430/254; 430/353
[58] Field of Search ........... 430/138, 527, 353, 253, 430/254, 203

[56] References Cited

U.S. PATENT DOCUMENTS

| 4,142,899 | 3/1979 | Sato et al. | 430/213 |
| 4,871,643 | 10/1989 | Tamagawa et al. | 430/138 |
| 4,877,712 | 11/1989 | Namiki et al. | 430/263 |
| 4,883,738 | 11/1989 | Yamada | 430/138 |
| 4,885,224 | 12/1989 | Yamamoto et al. | 430/138 |

FOREIGN PATENT DOCUMENTS 0203613 3/1986 European Pat. Off. .

Primary Examiner—Charles L. Bowers, Jr.
Assistant Examiner—Thorl Chea
Attorney, Agent, or Firm—Sughrue, Mion, Zinn Macpeak & Seas

[57] ABSTRACT

An image-forming method comprises the steps of image-wise exposing to light a light-sensitive material comprising a support and a light-sensitive layer provided thereon which contains silver halide, a reducing agent and an ethylenically unsaturated polymerizable compound, at least the silver halide and the polymerizable compound being contained in a microcapsule; simultaneously or thereafter heat-developing the light sensitive material; and pressing the light-sensitive material on an image-receiving material comprising a support and a porous image-receiving layer which contains a fluorine compound to transfer the unpolymerized polymerizable compound to the image-receiving material. Also disclosed is an image-forming method comprising the steps of imagewise exposing to light a light-sensitive material comprising a support and a light-sensitive layer provided thereon which contains a photopolymerizable composition or a photopolymerizable compound, the photopolymerizable composition or the photopolymerizable compound being contained in a microcapsule; and pressing the light-sensitive material on the above-mentioned image-receiving material to transfer the unpolymerized photopolymerizable composition or the unpolymerized photopolymerizable compound to the image-receiving material.

18 Claims, No Drawings

IMAGE-FORMING METHOD USING A LIGHT-SENSITIVE MATERIAL

FIELD OF THE INVENTION

The present invention relates to a method for forming an image through heat development using a light-sensitive material comprising a support and a light-sensitive layer provided therein which contains silver halide, a reducing agent and an ethylenically unsaturated polymerizable compound and at image-receiving material comprising a support and an image receiving layer provided thereon. The invention further relates to a method for forming an image through heat development using a light-sensitive material comprising a support and a light-sensitive layer provided thereon which contains a photopolymerizable composition or a photopolymerizable compound and an image-receiving material comprising a support and an image-receiving layer provided thereon.

BACKGROUND OF THE INVENTION

Image-forming methods using a light-sensitive material comprising a support and a light-sensitive layer containing silver halide, a reducing agent and a polymerizable compound are described in Japanese Patent Publications No. 45(1970).11149 (corresponding to U.S. Pat. No. 3,697,275), No. 47(1972)-20741 (corresponding to U.S. Pat. No. 3,687,667) and No. 49(1974)-10697, and Japanese Patent Provisional Publication No. 57(1982)-138632 and No. 58(1983)-169143. In the image-forming methods disclosed in the above-mentioned publications, when the exposed silver halide is developed using a developing solution, the polymerizable compound (e.g., vinyl compound) is induced to polymerize in the presence of a reducing agent to form a polymer image. Thus, this method need a wet development process using a developing solution. Therefore, the process takes a relatively long time.

An improved image-forming method employing a dry process is described in Japanese Patent Provisional Publications No. 61(1986)-69062 and No. 61(1986)-73145 (the contents of both publications are described in U.S. Pat. No. 4,629,676 and European Patent Provisional Publication No. 0174634A2). In this image-forming method, a recording material (light-sensitive material) comprising a light-sensitive layer containing a light-sensitive silver salt (silver halide), a reducing agent, a cross-linkable compound (a polymerizable compound) and a binder provided on a support is imagewise exposed to light to form a latent image of the silver halide, and then the material is heated to polymerize within the area where the latent image of the silver halide has been formed. The above-described image-forming method using a dry process is also described in Japanese Patent Provisional Publications No. 61(1986)-183640 and No. 61(1986)-188535.

Also known is an image-forming method in which the polymerizable compound within the area where a latent image of the silver halide has not been formed is polymerized to form an image, as described in Japanese Patent Provisional Publication No. 61(1986) 260241. In this image-forming method, polymerization of the polymerizable compound is restrained within the area where a latent image of the silver halide has been formed, and polymerization of the polymerizable compound within other area (area where a latent image has not been formed) is accelerated.

The image-forming method using a light-sensitive material having a light-sensitive layer which contains a photopolymerizable composition or a photopolymerizable compound on a support is a method in which a polymer image is formed in the area which has been exposed to light by imagewise exposure. Such image-forming method and a light-sensitive material used therefor are described in Japanese Patent Provisional Publications No. 52(1982)-89915, No. 57(1982)-179836, No. 58(1983)-88739, No.58(1983)-88740 and No. 60(1985)-259490.

The image-forming method using the light-sensitive material having the above.mentioned constitution generally comprises the steps of imagewise forming a polymer compound on the light-sensitive material, then superposing the light-sensitive material on an image-receiving material having an image-receiving layer, and pressing the light-sensitive material on the image-receiving material to transfer the unpolymerized compound (or unpolymerized photopolymerizable composition or unpolymerized photopolymerizable compound) to the image-receiving material. In the above-mentioned image-forming method, particularly preferably employed is a light-sensitive material in which the silver halide and the polymerizable compound are contained in a microcapsule or a light-sensitive material in which the photopolymerizable composition or the photopolymerizable compound is contained in a microcapsule.

In the field relating to recording sheets for various recording materials, there are known methods for supplying an increased amount of image-forming substances such as a dye or a dye precursor to enhance the image quality. For example, in the field of ink-jet recording or the field relating to image-receiving sheets (image-receiving material) for thermal transferring, voids are formed in the image-receiving sheet to increase the space for the image-forming substance, whereby the image-forming substance can be supplied in an increased amount, as described in Japanese Patent Provisional Publications No. 59(1984)-68292, No. 59(1984)-68293, No. 59(1984)-68294, No. 61(1986)-217289, No. 61(1986)-164892 and No. 61(1986)-164893. These methods are very effective from the viewpoint of supplying an increased amount of the image-forming substance to the image-receiving sheet, and they can be advantageously utilized in the image formation system using the light-sensitive material and the image-receiving material which includes a transferring (-by-pressing procedure. However, the above-mentioned image-forming method needs a pressing procedure (100 to 500 kg/cm$^2$), so that when the voids are formed in the image-receiving layer as described above, the voids are apt to diminish. Further, when the image-forming method is carried out at a high temperature and a high humidity (e.g., 30° C. and 80 %RH), a part of the image-receiving layer sometimes sticks to the surface of the light-sensitive layer in the procedure peeling (separation) the image-receiving material from the light-sensitive material, that is, agglomeration breakage occurs.

SUMMARY OF THE INVENTION

The object of the invention is to provide an image-forming method utilizing heat development in which an operation for peeling the image-receiving material from the light-sensitive material after the transferring-by-pressing procedure can be readily performed and an excellent transferred image can be obtained.

There is provided by the present invention an image-forming method which comprises the steps of:

imagewise exposing to light a light-sensitive material comprising a support and a light-sensitive layer provided thereon which contains silver halide, a reducing agent and an ethylenically unsaturated polymerizable compound, at least said silver halide and said polymerizable compound being contained in a microcapsule; light-sensitive material; and pressing the light-sensitive material on an image-receiving material comprising a support and a porous image-receiving layer which contains a fluorine compound (i.e., fluorine atom-containing compound) to transfer the unpolymerized polymerizable compound to the image-receiving material.

There is also provided by the invention an image-forming method which comprises the steps of:

imagewise exposing to light a light-sensitive material comprising a support and a light-sensitive layer provided thereon which contains a photopolymerizable composition or a photopolymerizable compound, said photopolymerizable composition or said photopolymerizable compound being contained in a microcapsule; and pressing the light-sensitive material on an image-receiving material comprising a support and a porous image-receiving layer which contains a fluorine compound (i.e., fluorine atom-containing compound) to transfer the unpolymerized photopolymerizable composition or the unpolymerized photopolymerizable compound to the image-receiving material.

The terms "porous image-receiving layer containing a fluorine compound" used herein means that the fluorine compound may exists at any place in the porous image-receiving layer. For example, the fluorine compound may exist uniformly in the layer, or may exist only on the surface side of the layer. Otherwise, the fluorine compound may exist in the layer and exist in a large amount specifically on the surface side of the layer.

The image-forming method of the invention is a method of transferring the unpolymerized polymerizable compound to the image-receiving material under pressure. It has been confirmed by the present inventors that the adhesion on the surface of the image-receiving material where the polymer image has been transferred is decreased, probably the fluorine compound has a high oil repellency. Accordingly, the peeling (separation) of the image-receiving material from the light-sensitive material can be done easily after the transferring, and the agglomeration breakage does not occur.

It has been also confirmed that decrease of the image density does not occur. The reason has not been clarified yet, but it is thought that the polymerizable compound can move efficiently in spite of the presence of the fluorine compound through a great number of voids of the image-receiving layer; or the affinity of the color former contained in the polymerizable compound to the developer is enhanced in the presence of the fluorine compound.

Accordingly, by the use of an image-receiving material containing the fluorine compound, the image formation can be smoothly conducted, and a transferred image having high contrast can be obtained.

DETAILED DESCRIPTION OF THE INVENTION

The image-receiving material used in the image-forming method of the invention has a porous image-receiving layer containing a fluorine compound on a support.

The fluorine compound employable in the invention preferably is highly hydrophobic and has a low water absorption. Particularly preferred as the fluorine compound is a fluorine-containing surface active agent. The fluorine-containing surface active agent (may be an anionic, cationic, nonionic, or amphoteric) may be a low-molecular compound or a high-molecular compound (may be in the form of latex).

Examples of the low-molecular compounds include those described in U.S. Pat. Nos. 3,775,126, 3,589,906, 3,798,265, 3,779,768 and 4,407,937, West German Patent No. 1,293,189, U.K. Patent No. 1,259,398, U.K. Patent Application No. 58,431, Japanese Patent Provisional Publications No. 48(1973)-87826, No. 49(1974)-10722, No. 49(1974)-46733, No. 50(1975)-16525 and No. 50(1975)-113221, No. 50(1975)-161236, No. 51(1976)-7917, No. 51(1976)-32322, No. 51(1976)-106419, No. 51(1976)-151124, No. 51(1976)-151125, No. 51(1976)-151126, No. 51(1976)-151127, No. 51(197)-129229, No. 52(1977)-127974, No. 53(1978)-84712, No. 53(1978)-146622, No. 54(1979)-14224, No. 54(1979)-48520, No. 55(1980)-7762, No. 56(1981)-114944, No. 58(1983)-16233, No. 59(1984)-23344, No. 60(1985)-244945, No. 61.(1986)-20944, No. 61(1986)-51144, No. 62(1987) 173463 and No. 62(1987)-283334, Japanese Patent Publications No. 48(1973)-43140 and No. 52(1977)-16073, Research Disclosure No. 16,630, Research Disclosure No. 17341, and Research Disclosure No. 17,611.

Examples of the high-molecular compounds include those described in U.S. Pat. No. 4,175,969, No. 4,087,394, No. 4,016,125, No. 3,676,123, No. 3,679,411 and No. 4,304,852, Japanese Patent Provisional Publications No. 52(1977)-129520, No. 54(1979)-158222, No. 55(1980)-578422, No, 57(1982)-11342, No. 57(1982)-19735 and No. 57(1982)-179837, "Elements of Chemistry, No. 27, New Fluorine Chemistry", published by Japan Chemistry Association, 1980, and "Functional Polymers Containing Fluorine" written by Satokawa, published by Daily Industrial News Paper, 1982.

Concrete examples of the preferred fluorine compounds employable for the image-receiving material according to the present invention are described below.

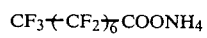  (1)

  (2)

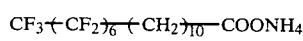  (3)

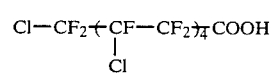  (4)

$$CF_3(CF_2)_6CO-N(CH_2)_2SO_3K \quad (5)$$
$$\quad\quad\quad\quad |$$
$$\quad\quad\quad\quad C_2H_5$$

$$CF_3(CF_2)_2-\text{C}_6H_4-SO_3K \quad (6)$$

$$CF_3(CF_2)_7SO_3K \quad (7)$$

$$CF_3(CF_2)_7SO_3Li \quad (8)$$

$$CF_3(CF_2)_7SO_3Na \quad (9)$$

$$CF_3(CF_2)_7SO_3NH_4 \quad (10)$$

$$CF_3(CF_2)_{11}-CH_2-OSO_3Na \quad (11)$$

$$H_2C-COOCH_2(CF_2)_6H \quad (12)$$
$$NaO_3S-CH-COOCH_2(CF_2)_6H$$

$$HOOC(CF_2-CF)_4COOH \quad (13)$$
$$\quad\quad\quad\quad |$$
$$\quad\quad\quad\quad Cl$$

$$CF_3(CF_2)_6CH=CH(CH_2)_3COONa \quad (14)$$

$$CF_3(CF_2)_7CO-N(CH_2)_2COONa \quad (15)$$
$$\quad\quad\quad\quad |$$
$$\quad\quad\quad\quad CH_3$$

$$CF_3(CF_2)_7SO_2-N-CH_2-COOK \quad (16)$$
$$\quad\quad\quad\quad\quad |$$
$$\quad\quad\quad\quad\quad C_3H_7$$

$$C_{16}H_{33}-CH-CONHCH_2(CF_2)_2H \quad (17)$$
$$\quad\quad |$$
$$\quad\quad SO_3Na$$

$$CF_3(CF_2)_7SO_2-NHCH_2CH_2-\overset{+}{N}(CH_2CH_3)_2-CH_2-COO^- \quad (18)$$

$$\text{(19)} \quad (CF_3)(C_2F_5)_2C-C(CF_3)(CH_2O(CH_2CH_2O)_7H)-CHF-CH_3$$

$$\text{(20)} \quad (CF_3)(C_2F_5)_2C-C(CF_3)(COONa)-CHF-CF_3$$

$$CF_3(CF_2)_7SO_2-N(CH_2)_2O(CH_2CH_2O)_{10}-H \quad (21)$$
$$\quad\quad\quad\quad\quad |$$
$$\quad\quad\quad\quad\quad C_2H_5$$

$$H(CF_2)_{10}-CH_2OH \quad (22)$$

$$CF_3(CF_2)_7COO(CH_2-CH(CH_3)-O)_4(CH_2CH_2O)_{20}-H \quad (23)$$

$$CF_3(CF_2)_7SO_2NH(CH_2)_3\overset{+}{N}-(CH_3)_3 \cdot I^- \quad (24)$$

$$CF_3(CF_2)_6CO_2-NHCH_2CH_2-\overset{+}{N}C_5H_5 \cdot I^- \quad (25)$$

$$CF_3(CF_2)_6CONH(CH_2)_3-\overset{+}{N}(CH_3)_2-CH_2CH_2-COO^- \quad (26)$$

$$CF(CF_2)_7SO_2NCH_2CH_2OSO_3H \quad (27)$$
$$\quad\quad\quad\quad\quad |$$
$$\quad\quad\quad\quad\quad CH_3$$

$$\text{(28)} \quad C_7F_{15}\text{-imidazolinium with HOH}_2C_2\text{ and }CH_2COO^-$$

$$\text{(29)} \quad C_7F_{15}COOCH_2\text{-disaccharide}$$

$$\text{(30)} \quad (F_3C)_2CF-O-(CF_2)_2CH_2-CH_2-CH(-)-CH_2-COOH \text{ (bis)}$$

$$C_8H_{17}SO_2NCH_2CH_2OP(O)(OH)_2 \quad (31)$$
$$\quad\quad\quad |$$
$$\quad\quad\quad C_2H_5$$

$$CF_3(CF_2)_{12}-COO(CH_2CH_2O)_{20}-H \quad (32)$$

$$F(CF(CF_3)-CF_2O)_2CF(CF_3)CONH(CH_2)_3N(CH_3)_2 \to O \quad (33)$$

$$C_9F_{19}CONH(CH_2)_3-\overset{+}{N}(CH_3)_2-CH_2COO^- \quad (34)$$

-continued
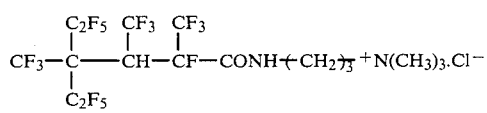 (35)
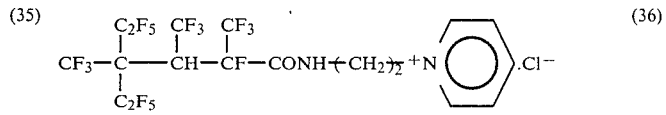 (36)
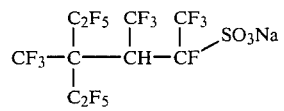 (37)
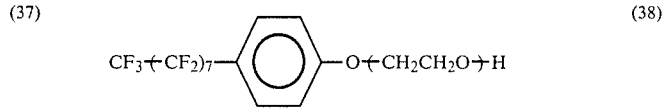 (38)
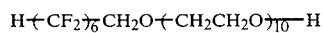 (39)
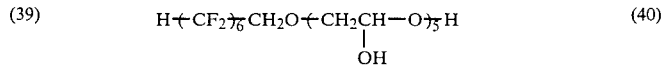 (40)
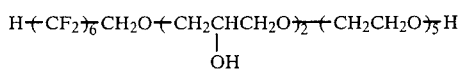 (41)
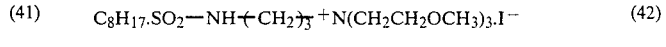 (42)
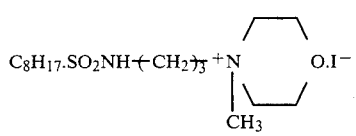 (43)
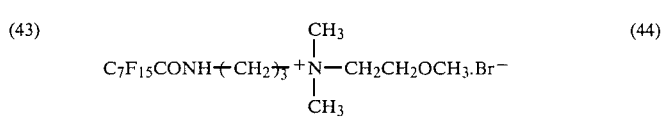 (44)
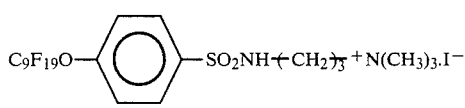 (45)
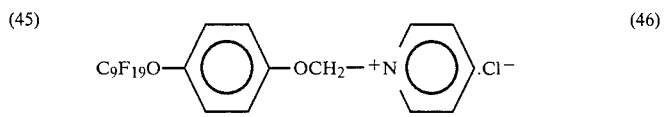 (46)
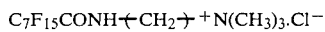 (47)
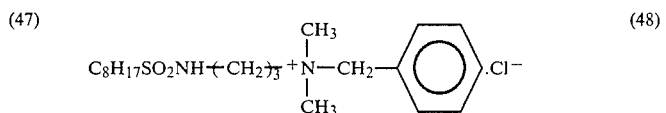 (48)
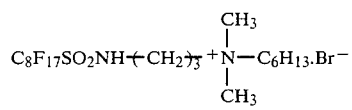 (49)
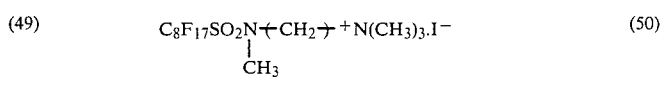 (50)
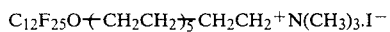 (51)
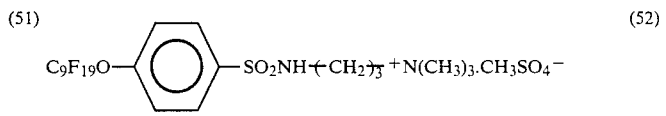 (52)
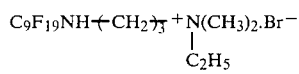 (53)
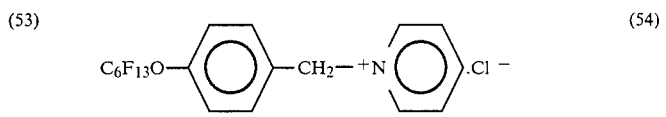 (54)
 (55)
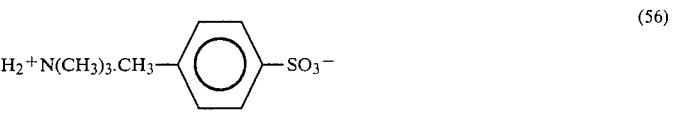 (56)
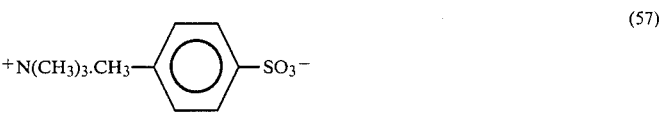 (57)
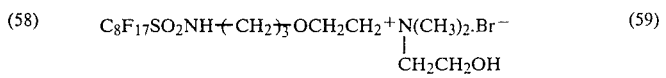 (58)
 (59)

-continued
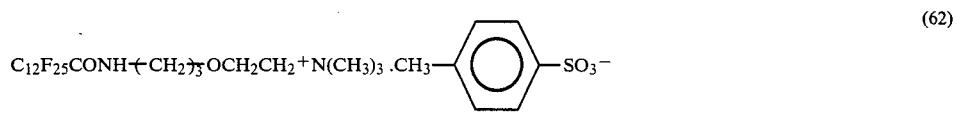
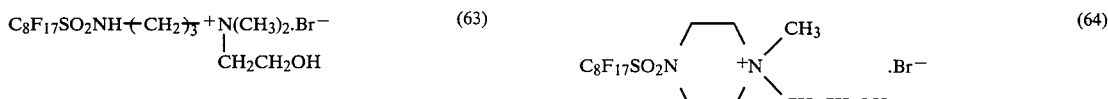
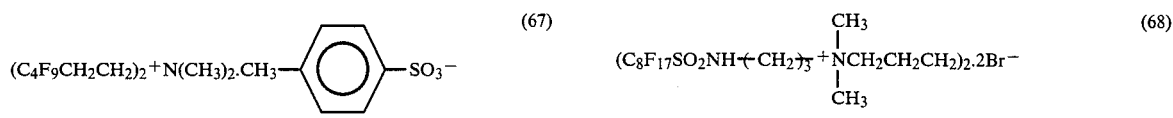
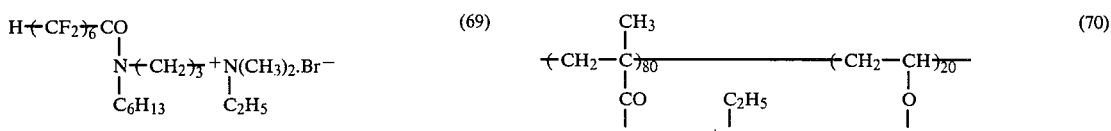
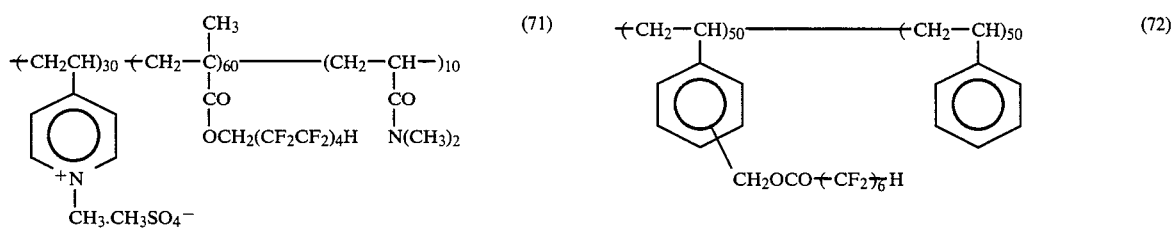
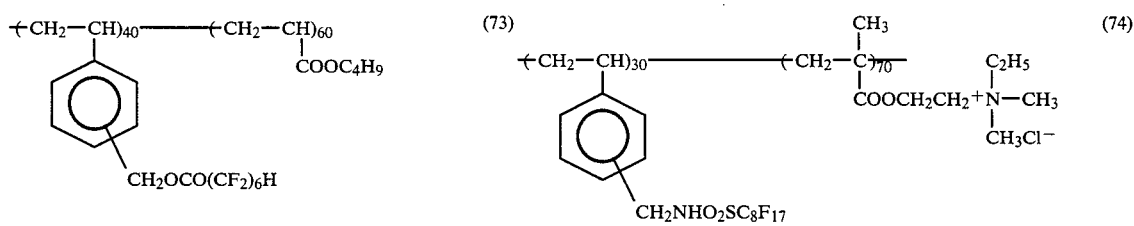
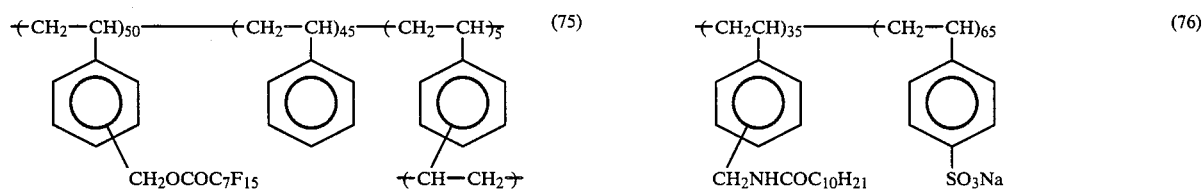
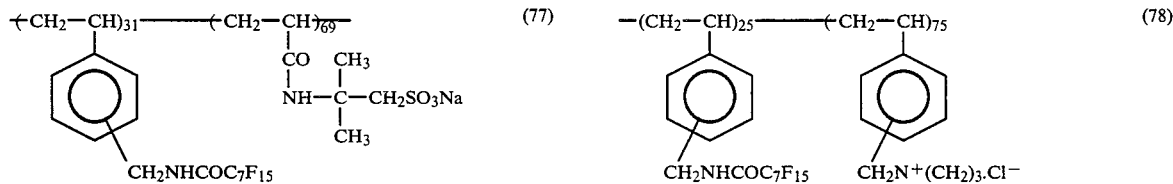

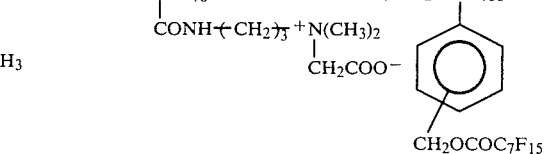

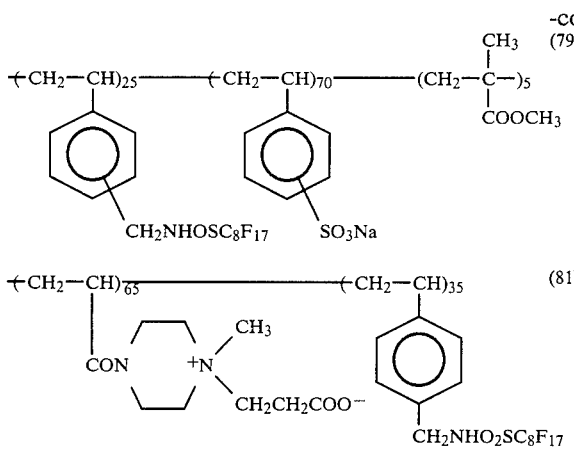

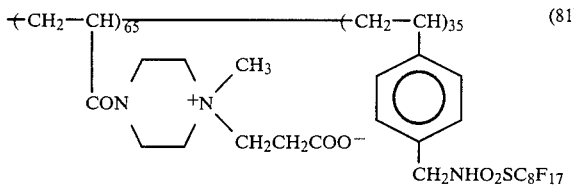

As the fluorine compound, fluorine-containing silane coupling agents can be employed in the invention.

Commercially available fluorine-containing surface active agents can be preferably employed in the invention.

Examples of the commercially available fluorine-containing surface active agents include perfluoroalkylcarboxylate (available from Asahi Glass Co., Ltd under tradename of Surfluon Slll.), perfluoroalkylphosphate (available from Asahi Glass Co., Ltd under tradename of Surfluon S112.), perfluoroalkylethyleneoxide addition product (available from Asahi Glass Co., Ltd under tradename of Surfluon S145 ), perfluoroalkylsulfonate (available from Dainippon Ink & Chemicals Inc. under tradename of Megafac F.110 ), and fluoropolymer latex (available from Daikin kogyo Co., Ltd under tradename of Dyefree ).

The above-mentioned fluorine-surface active agents can be employed singly or in combination.

In the invention, the fluorine-surface active agent preferably has a surface tension of not less than 25 dyne/cm.

Example of the preferred fluorine-containing surface active agents having such a high surface tensions are as follows.

(2) $n\text{-}C_7F_{15}SO_3Na$ (37.3 dyne/cm)

(8) $n\text{-}C_8F_{17}SO_3Li$ (29.8 dyne/cm)

(9) $n\text{-}C_8f_{17}SO_3Na$ (34.5 dyne/cm)

(10) $n\text{-}C_7f_{15}SO_3NH_4$ (27.8 dyne/cm)

perfluoroalkylphosphate (available from Asahi Glass Co., Ltd under tradename of Surfluon S112 ) (37.1 dyne/cm)

Among the above compounds, Surfluon S112 is most preferred.

In the invention, anionic or nonionic fluorine-containing surface active agents can be advantageously employed. In the case of using a color former as a color image-forming substance which is incorporated into the light-sensitive material as described later, an acidic developer is generally incorporated into the image-receiving layer of the image-receiving material. In this case, accordingly, anionic or nonionic fluorine-containing surface active agents are advantageously employed so as not to decrease the function of the developer.

For incorporating the fluorine compound into the image-receiving layer, a fluorine compound is added to a coating solution for the formation of an image-receiving layer. Alternatively, the fluorine compound is initially dispersed in water or an appropriate solvent to prepare a solution, and the solution is coated over the image-receiving layer. In the latter case, the solution is introduced into not only the surface of the image receiving layer but also inside of the layer. In the present invention, the latter procedure is preferably employed for the incorporation of the fluorine compound into the image-receiving layer.

The fluorine compound is preferably contained in the image-receiving layer in an amount of 0.01 to 1 g/m² in the present invention. In the case of incorporating the fluorine compound into the image-receiving layer by coating a solution containing the fluorine compound over the image-receiving layer, the amount of the fluorine compound contained in the image-receiving layer is more preferably in the range of 0.1 to 0.5 g/m². On the other hand, in the case of adding the fluorine compound to the coating solution for the formation of an image-receiving layer, the amount of the fluorine compound contained in the image receiving layer is more preferably in the range of 0.5 to 1 g/m².

The terms "image-receiving layer" used herein means a layer having one or more functions concerning the formation of an image. For example, the functions include a function of enhancing the surface smoothness of the image-receiving material to smoothly promote the image formation after transferring, a function of enhancing the image quality such as glossiness, and functions directly concerning the formation of an image and fixing thereof.

The above-mentioned fluorine-containing compound is contained in the porous image-receiving layer. For making an image-receiving layer porous, a variety of methods are known. In the invention, the image-receiving layer is preferably made porous by incorporating pigment particles thereinto.

There is no specific limitation on the pigment employable in the invention, and various known pigments can be employed. Examples of the pigments include titanium dioxide, zinc oxide, barium oxide, calcium carbonate, aluminum silicate and zirconium oxide. These pigments are preferably made bulky by conducting surface treatment, etc. Among these pigments, preferred are pigments having various crystalline structures, and most preferred is calcium carbonate.

The particle size of the pigment is preferably in the range of 0.1 to 50 μm, more preferably 0.5 to 10 μm. The pigment is preferably contained in the image-receiving layer in an amount of 0.5 to 60 g/m², more preferably 0.5 to 30 g/m².

The porous image-receiving layer generally contains a binder and a substance which develops to give a color in contact with a color image-forming substance and/or a substance for fixing the color. Further, other components such as a thermoplastic compound, a photopolymerization initiator and a thermal polymerization initiator may be contained in the image-receiving layer to provide the desired functions to the layer.

The components of the image-receiving layer is described hereinafter.

The binder employable in the invention is preferably hydrophilic. Representative hydrophilic binders are transparent or semi-transparent hydrophilic binders.

Further, a polymer having a transmission coefficient of oxygen of not more than $1.0 \times 10^{-11}$ $cm^3.cm.cm^2.sec.cmHg$ can be used as the binder as described in Japanese Patent Provisional Publication No. 62(9187)-209454, whereby the color image-forming substance transferred on the image-receiving layer is hardly denatured, and the color of the image formed on the image-receiving material hardly fades after storage of a long period of time or after storage under severe conditions.

The binder is preferably used in the image-receiving layer in an amount of 0.01 to 100 $g/m^2$, more preferably 0.1 to 10 $g/m^2$.

There is no specific limitation on the substance which develops to give a color under reaction with the color image-forming substance. Examples of the substances which develop to give a color in contact with the color image-forming substances include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper (in Japanese), 1975, pp. 29–58 (pressure-sensitive copying paper), pp. 87–95 (azography), pp. 118–120 (heat-sensitive color formation by chemical change) or in MSS. of the seminar promoted by the Society of Kinki Chemical Industry, "The Newest Chemistry of Coloring Matter —Attractive Application and New Development as a Functional Coloring Matter", pp. 26–32 (June 19, 1980). Examples of the color formation systems specifically include a color formation system used in pressure sensitive papers, etc., comprising a color former having a partial structure of lactone, lactam, spiropyran, etc., and an acidic substance (developer), e.g., acid clay, phenol, etc.; a system utilizing azo-coupling reaction between an aromatic diazonium salt, diazotate or diazo-sulfonate and naphthol, aniline, active methylene, etc.; a system utilizing a chelating reaction, such as a reaction between hexamethylene-tetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methozy-1-naphthol, etc.

Among the above.mentioned color formation systems, preferred is a color formation system using a color former and a developer. In this system, generally, a color former is contained in the light-sensitive layer and a developer is contained in the image-receiving layer. Examples of the acids, salts thereof and esters thereof. When a leuco dye is used as the color-image forming substance, zinc salts of salicylic acid derivatives are preferably employed, and 3,5-di-α-methylbenzyl zinc salicylate is most preferably employed.

The developer is preferably contained in the image-receiving layer in an amount of 0.1 to 50 $g/m^2$, more preferably 0.5 to 20 $g/m^2$.

In the case that the thermoplastic compound is contained in the image-receiving layer, the image-receiving layer itself is constituted in the form of agglomerated mass of a granular thermoplastic compound. Employment of the image-receiving layer having such constitution makes it possible to easily form a transferred image, and to give a glossy image under-heating after image formation. There is no specific limitation on the granular thermoplastic compound, and any known thermoplastic resin, wax, etc. can be employed in the invention. The glass transition point of the thermoplastic resin or the melting point of wax is preferably not higher than 200 °C, respectively. The thermoplastic compound preferably has a mean particle size of 0.05 to 100 pm, more preferably 0.5 to 20 $\mu m$. The thermoplastic compound is preferably contained in the image-receiving layer in an amount of 1 to 20 $g/m^2$, more preferably 0.1 to 5 $g/m^2$. The amount of the thermoplastic compound is preferably in the range of 2 to 100 wt.% based on the solid content of the image-receiving layer.

The image-receiving material having an image-receiving layer which contains the above.mentioned granular thermoplastic compound is described in Japanese Patent Provisional Publications No. 62(1987) 280071 and No. 62(1987) 280739.

The image-receiving layer may contain a photopolymerization initiator or a thermal polymerization initiator. By incorporating those components, fixing of the transferred image (image of unpolymerized polymerizable compound) can be easily and efficiently conducted. The image-receiving material having an image-receiving layer which contains the thermal polymerization initiator is described in Japanese Patent Provisional Publication No. 62(1987)-210444, and the image-receiving material having an image-receiving layer which contains the photopolymerization initiator is described in Japanese Patent Application No. 62(1987)-32887. In the invention, the fixing of the transferred image can be preferably conducted by using the thermal polymerization initiator.

The image-receiving material employable in the invention can be obtained by preparing a solution containing the aforementioned fluorine compound, adding other components (including optional components) to the solution to prepare a coating solution (or emulsion or dispersion) for the formation of an image-receiving layer, then coating the obtained solution (or emulsion or dispersion) over a support in a conventional manner, and drying the coated solution. Otherwise, the image-receiving layer is formed on a support in the same manner as described above using a coating solution for the formation of the image-receiving layer containing the above.mentioned components (including optional components), and then a solution containing the fluorine compound is coated on the image-receiving layer.

The thickness of the image-receiving layer preferably ranges from 5 to 500 $\mu m$, more preferably from 10 to 200 $\mu m$.

On the image-receiving layer can be provided a protective layer or other optional layers. An example of other optional layers is a layer consisting of granular thermoplastic compound. In the case of providing a layer of granular thermoplastic compound on the image-receiving layer, the formation of a transferred image can be readily made as in the case of incorporating the granular thermoplastic compound into the image-receiving layer, and in addition an image of high glossiness can be obtained under heating after the image formation. The thermoplastic compounds which may be employed in the image-receiving layer are also employable for the layer of the granular thermoplastic compound. The image-receiving material having such layer on the image-receiving layer is described in Japanese Patent Provisional Publication No. 62(1987)-10460.

Examples of the support material employable for the image-receiving material include glass, paper, fine paper, coat paper, cast coated paper, baryta paper, synthetic paper, metals and analogous thereof, polyester, acetyl cellulose, cellulose ester, polyvinyl acetal, polystyrene, polycarbonate, polyethylene terephthalate, and paper laminated with resin or polymer (e.g., polyethylene). Paper supports described in Japanese Patent Provisional Publication No. 63(1988)-186239 can be also employed.

In the case that a porous material such as paper is used as the support of the image-receiving material, the porous material preferably has such surface characteristics that a filtered maximum waviness of not less than 4 $\mu m$ is observed in not more than 20 positions among 100 positions which are determined at random on a filtered waviness curve obtained according to JIS-B-0610. In order to obtain a transparent image, the support should be made of a transparent material. In this case, the transmittance of the support preferably is not less than 30 %, more preferably not less than 50 %. The image-receiving material using a transparent support is described in Japanese Patent Provisional Publication No. 62(1987)-209530. There can be also employed a paper support using a paper having such a fiber length distribution that the total of 24 mesh residue by wt.% and 42 mesh residue by wt.% is in the range of 30 to 60 % as the fiber length distribution defined by JIS-P-8207, as described in Japanese Patent Provisional Publication No. 63(1988)-186239.

The image-forming method of the present invention is described in detail hereinafter.

In the case of the light-sensitive material comprising a support and a light-sensitive layer provided thereon which contains silver halide, a reducing agent, and an ethylenically unsaturated polymerizable compound (first embodiment), the image-forming method comprises the steps of imagewise exposing the light-sensitive material to light, heat-developing the light-sensitive material, and transferring the unpolymerized polymerizable compound to the above-described image-receiving material. In the case of the light-sensitive material comprising a support and a light-sensitive layer provided thereon which contains a photopolymerizable, composition or a photopolymerizable compound (second embodiment), the image-forming method comprises the steps of imagewise exposing the light-sensitive material to light and transferring the unpolymerized polymerizable compound (unpolymerized photopolymerizable composition or unpolymerized photopolymerizable compound) to the above-described image-receiving material.

The image-forming method is described below mainly based on the first embodiment using the light-sensitive material comprising a support and a light-sensitive layer provided thereon which contains silver halide, a reducing agent and an ethylenically unsaturated polymerizable compound.

The image formation on the light-sensitive material can be done by imagewise exposure of the light-sensitive material and heat-developing thereof.

Various exposure means can be employed in the image-wise exposure, and in general, a latent image of the silver halide is obtained by imagewise exposure to radiation including visible light. The type of light source and exposure can be selected depending on the light-sensitive wavelengths determined by spectral sensitization or sensitivity of the silver halide. Original image can be either monochromatic image or color image.

Development of the light-sensitive material can be conducted simultaneously with or after the imagewise exposure. The development is conducted by a heat development process using no developing solution, namely, a dry process.

Heating in the heat development process can be conducted in various known manners. A heating layer which may be arranged on the light-sensitive material can be used as the heating means in the same manner as the light-sensitive material described in Japanese Patent Provisional Publication No. 61(1986)-294434. The heating temperature for the development process usually ranges from 80 to 200° C., preferably from 100° to 200° C. The heating time is generally in the range of 1 second to 5 minutes, more preferably 5 seconds to 1 minute.

During the above development process, the polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

Thus, the polymerizable compound within the area where the latent image of the silver halide has been formed (or the area where the latent image of the silver halide has not been formed) is polymerized.

After the development process, the light-sensitive material is pressed on the image receiving layer of the image-receiving material to transfer the unpolymerized polymerizable compound to the image-receiving material. The pressing process can be carried out in various known manners. The pressure is preferably in the range of 100 to 1300 $kg/m^2$, more preferably 500 to 800 $kg/m^2$. After the transferring, the image-receiving material is separated (peeled off) from the light-sensitive material. Since the image-receiving layer contains the fluorine compound as described above, the peeling of the image-receiving material from the light-sensitive material can be done smoothly, and an image of a high density can be obtained. A general image-forming method using the image-receiving material is described in Japanese Patent Provisional Publication No. 61(1986)-278849. Further, a variety of image-recording apparatus suitable for performing the image-forming method are proposed in Japanese Patent Provisional Publication No. 61(1987)-147461.

The image-forming method of the present invention can be applied to various image formation systems, such as monochromatic or color photography, printing, radiography, diagnosis (e.g., CRT photography of diagnostic device using ultrasonic wave), copy (e.g., computer graphic hard copy), etc.

The components of the light-sensitive material are described below.

As described before, the terms "light-sensitive material" used herein include the light-sensitive material of the first embodiment and the light-sensitive material of the second embodiment. Hereinafter, the light-sensitive material of the first embodiment is mainly described.

Examples of the silver halide employable in the light-sensitive material include silver chloride, silver bromide, silver iodide, silver chlorobromide, silver chloroiodide, silver iodobromide and silver chloroiodobromide in the form of grains.

The halogen composition of individual grains may be homogeneous or heterogeneous. The heterogeneous grains having a multi-layer structure in which the halogen composition varies from the outer surface portion (i.e., shell) to the inside portion (i.e., core) are described Japanese Patent Provisional Publication Nos. 57(1982)-154232, 58(1983)-108533, 59(1984)-48755 and 59(1984)-52237, U.S. Patent No. 4,433,048, and European Patent No. 100,984. A silver halide grain having a core/shell structure in which the silver iodide content in the shell is higher tan that in the core can be also employed as described in Japanese Patent Provisional Publication No. 62(1987) 183453.

There is no specific limitation on the crystal habit of silver halide grains. For example, a tubular grain having an aspect ratio of not less than 3 can be used as described in Japanese Patent Provisional Publication No. 62(1987)-210455.

It is preferred to use silver halide grains having a relatively low fogging value, as described in Japanese Patent Provisional Publication No. 63(1988)-68830.

Two or more kinds of silver halide grains which differ in halogen composition, crystal habit, grain size, and/or other features from each other can be employed in combination.

There is no specific limitation on the grain size distribution of silver halide grains. For example, silver halide grains having an almost uniform grain size distribution can be employed, as described in Japanese Patent Provisional Publication No. 62(1987)-210448.

The silver halide grains preferably have a mean grain (or particle) size of 0.001 to 5 $\mu$m, more preferably 0.001 to 2 $\mu$m.

The amount of the silver halide grains contained in the light-sensitive layer preferably is in the range of 0.1 mg/m$^2$ to 10 g/m$^2$ in terms of silver contained the silver halide and an organic silver salt which is one of optional components. The amount of the silver halide contained in the light-sensitive layer preferably is not more than 1 g/m$^2$, more preferably in the range of 1 to 500 mg/m$^2$, in terms of silver only contained in the silver halide.

The reducing agent employed in the light-sensitive material has a function of reducing the silver halide and/or a function of accelerating or restraining polymerization of the polymerizable compound. There are known various reducing agents having the above-mentioned function. Examples of such reducing agents include hydroquinone, catechol, p-aminophenol, p-phenylenediamine, 3-pyrazolidone, 3-aminopyrazole, 4-amino-5-pyrazolone, 5-aminouracil, 4,5-dihydroxy-6-aminopyrimidine, reductone, aminoreductone, o- or p-sulfonamidophenol, o- or p-sulfonamidonaphthol, 2-sulfonamidoindanone, 4-sulfonamido. 5-pyrazolone, 3-sulfonamidoindole, sulfonamidopyra. zolobenzimidazole, sulfonamidopyrazolotriazole, α-sulfonamidoketone and hydrazine.

By adjusting the kind, amount, etc. of the above reducing agent, the polymerizable compound can be polymerized within the area where a latent image of the silver halide has been formed or the area where a latent image of the silver halide has not been formed. In the case that the polymerizable compound is polymerized within the area where the latent image of the silver halide has not been formed, preferably employed is 1-phenyl-3-pyrazolidone as the reducing agent.

Various reducing agents having the above-mentioned functions (including compounds referred to as developing agent, hydrazine derivative) are described in Japanese Patent Provisional Publications 61(1986)-183640, No. 61(1986)-183545, No. 61(1986)-228441, No. 62(1987)-70836, No. 61(1987)-86354, No. 62(1987)-86355, No. 62(1987)-198849, and Japanese Patent Application No. 60(1985)-227528. These reducing agents are also described in T. James, "The Theory of the Photographic Process", 4th edition, pp. 291-334 (1977), Research Disclosure Vol. 170, No. 17029, pp. 9-15 (June 1978), and Research Disclosure Vol. 176, No. 17643, pp. 22-31 (December 1978). Further, there can be also employed a reducing agent precursor capable of releasing a reducing agent under heating or in contact with a base. In the light-sensitive material used in the invention, various reducing agents and reducing agent precursors described in the above publications, applications and literatures can be effectively employed. Thus, "the reducing agent(s)" in the present specification means to include all of the reducing agents and reducing agent precursors described in the above publications, etc.

These reducing agents can be used singly or in combination. In the case that two or more reducing agents are used in combination, certain interactions between there reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induced or inhibits the polymerization of the polymerizable compound via oxidation-reduction reaction with other reducing agent. Both interactions may occur simultaneously. Thus, it is difficult to determine which of the interactions has occurred in practical use.

Concrete examples of the above.mentioned reducing agents include pentadecylhydroquinone, 5-t-butylcatechol, p-(N,N-diethylamino)phenol, 1-phenyl-4-methyl-4-hydoroxymethyl-3-pyrazolidone, 1-phenyl-4-methyl-4-heptadecylcar. bonyloxymethyl-3-pyrazolidone, 2-phenylsulfonylamino-4-hexadecyloxy-5-t-octylphenol, 2-phenylsulfonylamino-4-t-butyl-5-hexadecyloxy-phenol, 2-(N-butylcarbamoyl)-4-phenylsulfonylaminonaphthol and 2-(N-methyl-N-octadecylcarbamoyl)-4-sulfonylaminonaphthol, 1-acetyl 2-phenylhydrazine, 1-acetyl-2 -{(p- or)o-aminophenyl}hydrazine, 1-formyl-2 {(p- or o)-aminophenyl}hydrazine, 1-acetyl-2{(p- or o)-methoxy-phenyl}hydrazine, 1-lauroyl-2-{(p- or o-) aminophenyl}hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)butyloyl}-2-(p- or o-aminophenyl) hydrazine, 1-{2-(2,5-di-t-pentylphenoxy)butyloyl}-2-(p- or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}-phenyl]-hydrazine, 1-{4-(2,5-di-tert-pentylphenoxy) butyloyl}-2-(p- or o- methoxyphenyl)hydrazine, 1-(methoxycarbonylbenzohydryl)-2-phenylhydrazine, 1-formyl-2-[4-{2-(2,4-di-tert-pentylphenoxy)butlamide}phenyl hydrazine, 1-acetyl-2-[4-{2-(2,4-di-tert-pentylphenoxy)-butylamido}-phenyl]hydrazine, 1-trityl-2-[{2,6-dichloro-4-(N,N-di-2-ethylhexyl)carbamoyl}phenyl]-hydrazine, 1-(methoxycarbonylbenzohydryl)-2-(2,4-dichlorophenyl)hydrazine, 1-trityl-2-[}2-(N-ethyl-N-octylsulfamoyl)-4-methanesulfonyl}-phenyl]-hydrazine, 1-benzoyl-2-tritylhydrazine, 1-(4-butoxybenzoyl)-2-tritylhydrazine, 1-(2,4-dimethoxybenzoyl)-2-tritylhydrazine, 1-(4-dibutylcarbamoylbenzoyl) 2-tritylhydrazine and 1-(1-naphthoyl)-2-tritylhydrazine.

The amount of the reducing agent in the light-sensitive layer preferably ranges from 0.1 to 1,500 mole % based on 1 mole of silver (including the above-mentioned silver halide and the optional organic silver salt).

There is no specific limitation with respect to the polymerizable compound, except that the compound has to have an ethylenic unsaturated bond. Polymerizable liquid compounds having a relatively high boiling point (e.g., 80° C. or higher) that are hardly evaporated upon heating are preferably employed. In the case that the light-sensitive layer contains a color image-forming substance, the polymerizable compounds are preferably cross-linkable compounds having plural polymerizable groups in the molecule, because such cross-linkable compounds favorably serve for fixing the color image forming substance in the course of polymerization-hardening of the polymerizable compounds. As the polymerizable compounds, compounds having a high viscosity are preferably employed as is described for the light-sensitive material in Japanese Patent Provisional Publication No. 61(1986)-150079.

The ethylenically unsaturated polymerizable compounds employable in the light-sensitive material are described in the aforementioned or later-mentioned publications concerning to the light-sensitive material.

Polymerizable compounds employable for the light-sensitive material are compounds which are polymerizable through addition reaction or ring-opening reaction. Examples of the compounds being polymerizable through addition reaction include compounds having an ethylenic unsaturated group. Examples of the compounds being polymerizable through ring-opening reaction include the compounds having an epoxy group. Preferred are compounds having one or more ethylenic unsaturated groups.

Examples of the compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic acid esters, itaconic acid esters, styrene, styrene derivatives, vinyl ethers, vinyl esters, N-vinyl heterocyclic compounds, allyl ethers, allyl esters, and derivatives thereof.

Concrete examples of the acrylic esters include n-butyl acrylate, cyclohexyl acrylate, 2-ethylhexyl acrylate, benzyl acrylate, furfuryl acrylate, ethoxyethoxyethyl acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, dipentaerythritol hexacrylate, diacrylate of polyoxyethylenated bisphenol A, diacrylate of 2,2-dimethyl-3-hydroxypropane aldehyde and trimethylolpropane condensate, triacrylate of 2,2-dimethyl-3-hydroxypropionaldehyde and pentaerythritol condensate, polyacrylate of hydroxypolyether, polyester acrylate and polyuretane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate , pentaerythritol trimethacrylate, pentaerythritol tetramethacrylate, and dimethacrylate of polyoxyalkylenated bisphenol A.

The polymerizable compounds can be used singly or in combination of two or more compounds. The light-sensitive material containing a mixture of two or more polymerizable compounds is described in Japanese Patent Provisional Publication No. 62(1987)-210445. Further, compounds formed by bonding a polymerizable group such as a vinyl group or a vinylidene group to a reducing agent is also employed as the polymerizable compounds. The light-sensitive materials using compounds which show functions as both the reducing agent and the polymerizable compound or both the color image-forming substance and the polymerizable compound are included in embodiments of the light-sensitive material employable in the invention.

The amount of the polymerizable compound to be contained in the light-sensitive layer preferably ranges from 5 to 120,000 parts by weight, and more preferably from 12 to 12,000 parts by weight, per one part by weight of the silver halide grains.

In the present invention, the light-sensitive layer of the light-sensitive material may be a layer containing a photopolymerizable composition or a photopolymerizable compound (second embodiment) instead of the above-mentioned silver halide-containing light-sensitive layer (first embodiment).

As the photopolymerizable composition, a mixture of a photopolymerization initiator and a polymerizable compound can be employed. The polymerizable compound employable for the photopolymerizable composition is the same as the above-mentioned polymerizable compound.

Examples to the photopolymerization initiators include α-alkoxyphenylketones, polycyclic quinones, benzophenones, substituted benzophenones, xanthones, thioxanthones, halide compounds (e.g., chlorosulfonyl polynuclear aromatic compounds, chloromethyl polynuclear aromatic compounds, chlorosulfonylbenzophenones, chloromethylbenzophenones, fluorenones), haloalkanes, α-halo-α-phenylacetophenones, redox couples of photo reducible dye and reducing agent, halogenated paraffin (e.g., brominated paraffin, chlorinated paraffin), benzoyl alkyl ethers, lophine dimermercapto compound couples. Aromatic ketones are preferred.

Concrete examples of the photopolymerization initiators include 2,2-dimethoxy-2-phenylacetophenone, 9,10-anthraquinone, benzophenone, Michler's ketone, 4,4-diethylaminobenzophenone, xanthone, chloroxanthone, thioxanthone, chlorothioxanthone, 2,4-diethylthioxanthone, chlorosulfonylanthraquinone, chlorosulfonylxanthone, chloromethylanthracene, chloromethylbenzothiazole, chlorosulfonylbenzoxazole, chloromethylquinoline, chloromethylbenzophenone, chlorosulfonylbenzophenone, fluorenone, carbon tetrabromide, benzoin butyl ether, benzoin isopropyl ether, a combination of 2,2'-bis(o-chlorophenyl)-4,4',5,5'-tetraphenylbiimidazole and 2-mercapto-5-methylthio-1,3,4-thiadiazole.

The photopolymerization initiator can be employed singly or in combination of two or more compounds.

The photopolymerization initiator is preferably used in an amount of 0.5 to 30 wt.%, more preferably 2 to 20 wt.%, based on the amount of the polymerizable compound.

Instead of the photopolymerizable composition, a photopolymerizable compound having photopolymerization property can be employed.

Examples of the photopolymerizable compounds include ester silicate such as acrylamide, barium acrylate, glycerol triacrylate, N,N'-methylenebisacrylamide, polyethylene glycol diacrylate, pentaerythritol diacrylate, pentaerythritol triacrylate, vinylcarbazole and polyvinyl alcohol. A polymerizable compound having the light-sensitive group can be used as the photopolymerizable compound.

The silver halide and the polymerizable compound (or photopolymerizable composition or photopolymerizable compound in the case of the second embodiment) are contained in a microcapsule. Further, the reducing agent and the optionally employable color image-forming substances (e.g., color former in the case of two-component color formation system such as a color former/developer system) are preferably contained in the microcapsule.

There is no specific limitation on the shell materials of the microcapsules. The shell material of the microcapsule employable in the invention preferably has impermeability ability to the liquid to be contained in the light-sensitive layer in the image-formation stage. Light-sensitive materials using microcapsules having polyamide resin and/or polyester resin shell are described in Japanese Patent Provisional Publication No. 62(1987)-209437. Light-sensitive materials using microcapsules having polyurea resin and/or polyurethane resin shell are described in Japanese Patent Provisional Publication No. 62(1987)-209438. Light-sensitive materials using microcapsules having amino-aldehyde resin shell are described in Japanese Patent Provisional Publication No. 62(1987)-209439. Light-sensitive materials using microcapsules having gelatin shell are described in Japanese Patent Provisional Publication No. 62(1987)-209440. Light-sensitive materials using microcapsules having epoxy resin shell are described in Japanese Patent Provisional Publication No. 62(1987)-209441. Light-sensitive materials using microcapsules having multi-layer shell of polyamide resin and/or polyurea resin are described in Japanese Patent Provisional Publication No. 62(1987)-209447. The light-sensitive materials using microcapsules having multilayer shell of polyurethane resin, and/or polyester resin are described in Japanese Patent Provisional Publication No. 62.(1987)-209447.

In the case that the silver halide is contained in the microcapsule, the silver halide preferably exist in the shell wall of the microcapsule. The light-sensitive materials using microcapsules containing the silver halide in the shell material are described in Japanese Patent Provisional Publication No. 62(1987)-169147.

There can be employed two or more kinds of microcapsules in combination which are different from each other in at least one component among the components capable of being contained in microcapsules such as a silver halide, a reducing agent, a polymerizable compound and a color image forming substance. Especially in the case of forming a full-color image, three or more kinds of microcapsules having different color phases are preferably employed in combination. The light-sensitive materials using two or more kinds of microcapsules in combination are described in Japanese Patent Provisional Publication No. 62(1987)-198850.

The mean particle size of the microcapsules preferably is in the range of 3 to 20 $\mu$m. The microcapsule preferably has a uniform particle distribution as described in Japanese Patent Provisional Publication No. 63(1988)-5334. The thickness of the shell wall of the microcapsule preferably is within the value relative to the particle diameter of the microcapsule as described in Japanese Patent Provisional Publication No. 63(1988)-81336.

In the case that the silver halide grains are contained in microcapsules, the mean grain size of the silver halide preferably is not more than one fifth of the mean size of the microcapsules, more preferably not more than one tenth of the mean size of the microcapsules. When the mean size of the microcapsules is not more than one fifth of the mean grain size of silver halide, even and uniform image can be obtained.

The light-sensitive material comprises a support and the light-sensitive layer provided thereon which contains the above-mentioned components. There is no specific limitation on the support material, but preferably employed is a support material which is resistant to heat required for the development. As the support material of the light-sensitive material, there can be employed materials used as the aforementioned support materials of the image-receiving material.

Various embodiments of the light-sensitive materials, optional components which may be contained in the light-sensitive layer, and auxiliary layers which may be optionally arranged on the light-sensitive layer are described below.

The light-sensitive layer may further contain optional components such as color image-forming substances, sensitizing dyes, organic silver salts, radical generators, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, dyes decolored by irradiation with light, matting agents, antismudging agents, plasticizers, water releasers, binders, photo polymerization initiators, solvents of the polymerizable compound, water soluble vinyl polymers and hardening agents.

There is no specific limitation with respect to the color image forming substance, and various kinds of substances can be employed. Examples of the color image forming substance include colored substance (i.e., dyes and pigments) and non-colored or almost non-colored substance (i.e.,color former, or dye. or pigment-precursor ) which develops to give a color under application of external energy (e.g., heating, pressing, light irradiation, etc.) or by contact with other components (i.e., developer). In the invention, a color former is preferably employed as described above.

Pigments can be also employed as the color image-forming substance. Examples of the pigments employable as the color image-forming substance include commercially available pigments as well as pigments described in various technical publications such as "Handbook of Color Index", "New Handbook of Pigments", (Nippon Ganryo Gijutsu Kyokai (ed.,), 1977 ), "New Applied Technique of Pigments", (CMC Publishing, 1986 ), and "Technique of Printing Ink", (CMC Publishing, 1984 ).

As the types of the pigments based on the color, there are known white pigments, black pigments, yellow pigments, orange pigments, brown pigments, red pigments, violet pigments, blue pigments, green pigments, fluorescent pigments, metal powder pigments and polymer pigment,. Concrete examples of the pigments employable in the invention include insoluble azo pigments, azo lake pigments, condensation azo pigments, chelate azo pigments, phthalocyanine pigments, anthraquinone pigments, perylene pigments, perynone pigments, thioindigo pigments, quinacridone pigments, dioxadine pigments, isoindolinone pigments, quinophthalone pigments, dye-type lake pigments, azine pigments, nitroso pigments, nitro pigments, natural pigments, fluorescent pigments, and inorganic pigments. Those pigments can be per se employed or can be used after being subjected to surface treatment. As the surface treatment, there can be employed a method of coating a resin or wax on the surface of the pigment, a method of depositing a surface active agent thereon, a method of bonding a reaction substance (e.g., silane coupling agent, epoxy compound and polyisocyanate) to the surface of the pigment, etc. Those methods are described in "Nature and Application of Metal Soap", (Saiwai Shobo ), "Technique of Printing Ink", (CMC Publishing, 1984 ), and "New Applied Technique of Pigments", (CMC Publishing, 1986.).

The particle size of the pigment employable in the invention is preferably in the range of 0.01 to 10 μm, more preferably 0.05 to 1 μm, in the dispersed state in the polymerizable compound.

The pigment is preferably used in an amount of 5 to 120 parts by weight, more preferably 10 to 60 parts by weight, based on 100 parts by weight of the polymerizable compound.

The pigment can be dispersed in the polymerizable compound by known dispersing methods used in processes for preparing a ink or a toner. As the dispersing device, there can be employed a sand mill, an attritor, a pearl mill, a super mill, a ball mill, an impeller, a disperser, a KD mill, a colloid mill, a dynatron, a three-roll mill, a press kneader, etc. Details of the devices are described in "New Applied Technique of Pigments", (CMC Publishing, 1986).

The light-sensitive materials using the color image-forming substance are described in Japanese Patent Provisional Publication No. 61(1986)-73145. A light-sensitive material using a dye or pigment as the color image forming substance is described in Japanese Patent Provisional Publication No. 62(1987)-187346. A light-sensitive material using a leuco dye is described in Japanese Patent Provisional publication No. 62(1987)-209436. A light-sensitive material using a triazen compound is described in Japanese Patent Provisional Publication No. 62(1987)-251741. A light-sensitive material using a leuco dye which gives a yellow color is described in Japanese Patent Provisional Publication Nos. 62(1987)-288827 and 62(1987)-288828. A light-sensitive material using a leuco dye which gives a cyan color is described in Japanese Patent Provisional Publication Nos. 63(1988)-53542.

The color image-forming substance is preferably used in an amount of 0.5 to 50 parts by weight, more preferably 2 to 30 parts by weight, per 100 parts by weight of the polymerizable compound. In the case that the developer is employed, the amount of the developer is preferably in the range of approx. 0.3 to 80 parts by weight per one part by weight of the color former.

There is no specific limitation with respect to the nature the sensitizing dye, and any known sensitizing dyes used in the conventional photographic art may be employed in the light-sensitive material. The amount of the sensitizing dye to be added generally ranges from approx. $10^{-8}$ a to $10^{-2}$ mole per 1 mole of the silver halide.

The sensitizing dye is preferably introduced in the stage of the preparation of the silver halide emulsion. The sensitizing dye can be introduced in the stage of the preparation of the silver halide grains as described in Japanese Patent Provisional Publication No. 62(1987)-947. The sensitizing dye can be also introduced in the stage of the preparation of the silver halide emulsion after preparing the silver halide grains as described in Japanese Patent Provisional Publication No. 62(1987) 210449. Concrete examples of the sensitizing dyes are described in Japanese Patent Provisional Publication Nos. 62(1987)-947 and 62(1987)-210449. The sensitizing dye having a sensitivity within the infrared region can be also employed in combination as described in Japanese Patent Provisional Publication No. 62(1987)-210449.

Incorporating of an organic silver salt into the light-sensitive material is particularly effective for the heat development. The reason is assumed that the organic silver salt takes part in a redox reaction using a silver halide latent image as a catalyst when heated to a temperature of 80° C. or higher. In such case, the organic silver salt is preferably positioned in contact with the silver halide or closely to the silver halide. Examples of the organic compounds employable for forming such organic silver salt include aliphatic or aromatic carboxylic acids, thiocarbonyl group-containing compounds having a mercapto group or an α-hydrogen atom, and imino group containing compounds. Particularly prefered is benztriazole. The organic silver salt is generally used in an amount of from 0.01 to 10 mole, preferably from 0.01 to 1 moles, per 1 mole of the silver halide. Instead of the organic silver salt, an organic compound (i.g., benzotriazole) which can form an organic silver salt in combination with an inorganic silver salt can be incorporated into the light-sensitive layer to obtain the same effect. The light-sensitive material using the organic silver salt is described in Japanese Patent Provisional Publication No. 62(1987)-3246. The above-mentioned organic silver salt is preferably used in an amount of 0.1 to 10 moles, more preferably 0.01 to 1 mole, per 1 mole of the silver halide.

A radical generator which accelerates (or inhibits) polymerization of the reducing agent may be contained in the light-sensitive layer. A light-sensitive material using triazene silver as the radical generator is described in Japanese Patent Provisional Publication No. 62(1987)-195639. A light-sensitive material using a silver diazotate as the radical generator is described in Japanese Patent Provisional Publication No. 62(1987)-195640. A light-sensitive material using an azo compound as the radical generator is described in Japanese Patent Provisional Publication No. 62(1987)-195641.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to the image-receiving layer of the image-receiving material, or a similar function. The image formation accelerators can be classified into inorganic bases, organic bases, base precursors, oils, surface active agents, compounds functioning as an anti-fogging agent and/or a development accelerator, hot-melt solvents, compounds functioning as antioxidants, and the like, from the viewpoint of physicochemical functions. These groups, however, generally have certain combined functions, that is, two or more of the above-mentioned effects, so that the above classification is for the sake of convenience, and one compound often has a plurality of functions combined.

Examples of the image formation accelerators are given below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent; ammonium hydroxide; hydroxides of quaternary alkylammoniums; and hydroxides of other metals. Preferred examples of the organic bases include aliphatic amines (e.g., trialkylamines, hydroxylamine and aliphatic polyamines); aromatic amines(e.g., N-alkyl-substituted aromatic amines, N-hydroxylalkyl-substituted aromatic amines and bis[p-(dialkylamino)-phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts of bases with organic acids capable of undergoing decarboxylation by heating, compounds capable of releasing amines through intramolecular nucleophilic substitution, Lossen rearrangement, or Beckmann rearrangement, and the like; and those capable of releasing a base by electrolysis. Examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and guanidine 4-acetylaminomethyl propionate.

The bases or the base precursors can be employed in an amount within a wide range in the light sensitive material. The base or base precursor is preferably employed in an amount of not more than 100 % by weight, more preferably from 0.1 to 40 % by weight, based on the total solid content of the light-sensitive layer. These bases or base precursors can be used singly or in combination.

The light-sensitive material employing the base or base precursors is described in Japanese Patent Provisional Publication No. 62(1987)-264041. A light-sensitive material. employing a tertiary amine as the base or base precursor is described in Japanese Patent Provisional Publication No. 62(1987)-170954. A light-sensitive material employing dispersed grains of hydrophobic base compound having a melting point of 80° C. to 180° C. is described in Japanese Patent Provisional Publication No. 62(1987)-209523. A light-sensitive material employing guanidine derivatives having a solubility of not more than 0.1 % is described in Japanese Patent Provisional Publication No. 62(1987)-215637. A light-sensitive material employing hydroxides of alkali metals or alkaline earth metals or salt is described in Japanese Patent Provisional Publication No. 62(1987)-209448.

A light-sensitive material employing acetylide compounds as the base precursor is described in Japanese Patent Provisional Publication No. 63(1988)-24242. A light-sensitive material employing salts of propiolic acid as the base precursor and further containing silver, copper, silver compound or copper compound as the catalyst of the base production reaction is described in Japanese Patent Provisional Publication No. 63(1988)-46446. A light-sensitive material containing the salts of propiolic acid under the condition of being separated from the silver, copper, silver compound or copper compound is described in Japanese Patent Provisional Publication No. 63(1988)-81338. A light-sensitive material containing free ligands in addition to the salts of propiolic acid and the silver, copper, silver compound or copper compound is described in Japanese Patent Provisional Publication No. 63(1988)-97942. A light-sensitive material employing salts of the propiolic acid as the base precursor and further containing heat fusible compounds as the accelerator of the base production reaction is described in Japanese Patent Provisional Publication No. 63(1988)-46447. A light-sensitive material employing a salt of sulfonyl acetate as the base precursor and further containing a heat fusible compound as the accelerator for the base production reaction is described in Japanese Patent Provisional Publication No. 63(1988)-48543. A light-sensitive material employing compounds in which isocyanate or isothiocyanate is bonded to an organic base is described in Japanese Patent Provisional Publication No. 63(1988)-24242.

In the case of using the base or the base precursor in the light-sensitive material, it is preferred that the silver halide, the reducing agent and the polymerizable compound are contained in the aforementioned microcapsules, and the base or base precursor is arranged outside of the microcapsule in the light-sensitive layer. Otherwise, the base or base precursor can be contained in different microcapsules from those containing the polymerizable compound as described in Japanese Patent Provisional Publication No. 62(1987)-209521. The base or base precursor can be contained in the microcapsules under the condition that the base or base precursor is dissolved or dispersed in an aqueous solution of a water retention agent as described in Japanese Patent Provisional Publication No. 62(1987)-209522, or under condition that the base or base precursor is adsorbed on solid particles as described in Japanese Patent Provisional Publication No. 62(1987)-209526. The base or base precursor contained in the microcapsules preferably has a melting point in the range of 70° to 210° C. as described in Japanese Patent Provisional Publication No. 63(1988)-65437. Further, the base or base precursor can be dissolved in grains in combination with hydrophobic substance as described in Japanese Patent Provisional Publication No. 63(1988)-97943.

The base or base precursor can be contained in a layer different from the light-sensitive layer as described in Japanese Patent Provisional Publication No. 62(1987)-53140. The layer containing a base or base precursor will be described hereinafter. Further, the base or base precursor may be contained in the aforementioned porous support as described in Japanese Patent Provisional Publication No. 63(1988)-32546.

Examples of the oils employable in the invention include high-boiling organic solvents which are used as solvents for emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an anti-fogging agent and/or a development accelerator can be used to give an image of high sharpness having a high maximum density and a low minimum density (i.e., an image having high S/N ratio). Examples of the compounds functioning as an anti-fogging agent and/or a development accelerator include a conventional anti-fogging agent described in Japanese Patent Provisional Publication No. 62(1987) 151838; a compound having a cyclic amido structure described in Japanese Patent Provisional Publication No. 61(1986) 151841; a thioether compound described in Japanese Patent Provisional Publication No. 62(1987)-151842; a polyethylene glycol derivative described in Japanese Patent Provisional Publication No. 62(1987)-151843; a thiol derivative described in Japanese Patent Provisional Publication No,. 62(1987)-151844; an acetylene compound described in Japanese Patent Provisional Publication No. 62(1987)-178232; a sulfonamide derivative described in Japanese Patent Provisional Publication No. 62(1987)-183450; and a salt of quaternary ammonium ion described in Japanese Patent Provisional Publication No. 63(1988)-91653.

The hot-melt solvent preferably is compounds which may be used as a solvent of the reducing agent or one which is high dielectric constant and can accelerate physical development of silver salts. A light-sensitive material employing the hot-melt solvent is described in Japanese Patent Provisional Publication No. 62(1987)-86355.

The compounds functioning as an antioxidant can be employed for the purpose of eliminating the oxygen influence (oxygen functions as a polymerization inhibitor). An example of the compound functioning as an antioxidant is a compound having two or more mercapto groups as described in Japanese Patent Provisional Publication No. 62(1987)-209443.

The thermal polymerization initiators employable in the light-sensitive material are compounds which are decomposed under heating to generate a polymerization initiating species, particularly a radical, and those generally employed as an initiator of radical polymerization. The thermal polymerization initiators are described in "Addition Polymerization and Ring Opening Polymerization", pp. 6-18, edited by the Editorial Committee of High Polymer Experimental Study of the High Polymer Institute, published by Kyoritsu Shuppan (1983). The thermal polymerization initiator is preferably used in an amount of from 0.1 to 120 % by weight, more preferably from 1 to 10 % by weight, based on the amount of the polymerizable compound. In a system in which the polymerizable compound within the area where the latent image has not been formed is polymerized, the thermal polymerization initiator is preferably incorporated into the light-sensitive layer. The light-sensitive material using the thermal polymerization initiators is described in Japanese Patent Provisional Publication No. 62(1987)-70836.

The development stopping agents employable in the light-sensitive material are compounds to neutralize a base or react with a base to reduce the base concentration in the layer to hereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are in the form of particles which are solid at ambient temperatures. Examples of the antismudging agents include starch particles described in U.K. Patent No. 1,232,347; polymer particles described in U.S. Pat. No. 3,625,736; microcapsule particles containing no color former described in U.K. Patent No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 $\mu$m, more preferably 5 to 40 $\mu$m. The size of the particle is preferably larger than that of the microcapsule. In the case that the oily droplets of the polymerizable compound is in the form of microcapsules, the size of the particle is preferably larger than that of the microcapsule.

The binder employable in the light-sensitive material can be contained in the light-sensitive layer singly or in combination. The binder preferably is a hydrophilic binder, and representative hydrophilic binders are transparent or semi-transparent binders. Examples of the binders include natural substances such as gelatin, gelatin derivatives, cellulose derivatives, starch and gum arabic, and synthetic polymeric substances such as water-soluble polyvinyl compounds (e.g., polyvinyl alcohol, polyvinylpyrrolidone and acrylamide polymers). Other synthetic polymeric substances such as vinyl compounds dispersed in the form of latex, which are particularly effective to increase dimensional stability of photographic materials, can be also employed. The binder is preferably employed in an amount of 2 to 100 wt.% based on the amount of the polymerizable compound. The light-sensitive material using the binder is described in Japanese Patent Provisional Publication No. 61(1986)-69062. The light-sensitive material using both of the binder and the microcapsules is described in Japanese Patent Provisional Publication No. 62(1987)-209525.

A photopolymerization initiator can be contained in the light-sensitive layer of the light-sensitive material for the purpose of polymerization of the transferred unpolymerized polymerizable compound, as described in Japanese Patent Provisional Publication No. 62(1987)-161149.

In the case of using a solvent for the polymerizable compound, the solvent is preferably contained in a microcapsule which is different from the microcapsule containing the polymerizable compound. The light-sensitive material employing a polymerizable compound contained in a microcapsule and a blending organic solvent is described in Japanese Patent Provisional Publication No. 62(1987)-209524.

A water soluble vinyl polymer can be adsorbed on the aforementioned silver halide grains. The light-sensitive material employing the water soluble vinyl polymer is described in Japanese Patent Provisional Publication No. 63(1988)-91652.

Examples and usage of other components than the above-mentioned ones which can be optionally contained in the light-sensitive layer are also described in the above-mentioned publications concerning the light-sensitive material, and in Research Disclosure Vol. 170, No. 17029, pp. 9–15 (June 1978).

The light-sensitive layer of the light-sensitive material comprising the above-mentioned components preferably has a pH value of not more than 7 as described in Japanese Patent Provisional Publication No. 62(1987)-275235.

Examples of auxiliary layers which are optionally arranged on the light-sensitive layer include a heating layer, an antistatic layer, an anti-curling layer, a peel layer, a cover sheet, a protective layer, a layer containing a base or a base precursor, a base barrier layer and an anti-halation layer (colored layer).

The process for preparing the light-sensitive material is described below.

Various processes can be employed for preparing a light-sensitive material. In a generally known process, a light-sensitive material can be prepared by dissolving, emulsifying or dispersing each of the components of the light-sensitive layer in an adequate solvent to obtain a coating solution, then applying the solution onto the aforementioned support, and drying the coated layer of the solution.

The coating solution can be generally prepared by preparing liquid compositions each composition containing each component, and mixing those compositions with each other. Each of the liquid compositions may contain plural components. Some components of the light-sensitive layer can be directly added to the coating solution or the liquid composition. Further, a secondary composition can be prepared by emulsifying the oily (or aqueous) composition in an aqueous (or oily) medium to obtain the coating solution.

Processes for the preparation of the liquid composition and the coating solution are described below.

The silver halide emulsion can be prepared by any known process such as an acid process, a neutral process or an ammonia process.

In the stage for the preparation, a soluble silver salt and a soluble halogen salt can be reacted in accordance with a single jet process, a double jet process or a combination thereof. A reverse mixing method in which grains are formed in the presence of excess silver ions, or a controlled double jet process in which a pAg value is maintained constant, can be also employed. In order to accelerate grain growth, the concentrations or amounts or the silver salt and halogen salt to be added or the rate of their addition can be increased as described in Japanese Patent Provisional Publications Nos. 55(1980)-158124 and 55(1980)-158124 and U.S. Pat. No. 3,650,757.

The silver halide emulsion may be of a surface latent image type that forms a latent image predominantly on the surface of silver halide grains, or of an inner latent image type that forms a latent image predominantly in the inside of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Provisional Publication No. 58(1983)-3534 and Japanese Patent Publication No. 58(1983)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsion, various hydrophilic colloids are advantageously used as protective colloids. Examples of employable hydrophilic colloids include proteins (e.g., gelatin, gelatin derivatives, gelatin grafted with other polymers, albumin and casein), cellulose derivatives (e.g., hydroxyethyl cellulose and cellulose sulfate), saccharide derivatives (e.g., sodium alginate and starch derivative), and a wide variety of synthetic hydrophilic polymers, such as polyvinyl alcohol, partially acetalized polyvinyl alcohol, poly-N-vinylpyrrolidone, polyacrylic acid, polymethacrylic acid, polyacrylamide, polyvinylimidazole, and polyvinylpyrazole and copolymers comprising monomers constituting these homopolymers. Among them, gelatin is most preferred. Examples of the employable gelatin include not only lime-treated gelatin but also acid-treated gelatin and enzyme-treated gelatin. Hydrolysis products or enzymatic decomposition products of gelatin can be also employed.

In the formation of silver halide grains in the silver halide emulsion, ammonia, an organic thioether derivative (see: Japanese Patent Publication No. 47(1972)-386) or sulfur-containing compound (see: Japanese Patent Provisional Publication No. 53(1987)-144319) can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. For the chemical sensitization of the emulsion employable for the light-sensitive material, there can be employed sulfur sensitization, reduction sensitization or noble metal sensitization, etc, singly or in combination. Those chemical sensitization processes can be carried out in the presence of a nitrogen containing heterocyclic compound as described in Japanese Patent Provisional Publications Nos.58(1983)-126526 and 58(1983)-215644.

When a sensitizing dye is added to the silver halide emulsion, the sensitizing dye is preferably added in the stage of preparation of the emulsion as described in the above-mentioned Japanese Patent Provisional Publication Nos. 62(1987)-947 and 62(1987)-210449. When the nitrogen-containing heterocyclic compound functioning as an anti-fogging agent and/or a development accelerator is added to the silver halide emulsion, the compound is preferably added in the stage of the formation or ripening of the silver halide grains. The process for the preparation of the light-sensitive material employing the nitrogen-containing heterocyclic compound is described in Japanese Patent Provisional Publication No. 62(1987)-161144.

When the organic silver salt is contained in the light-sensitive layer, the emulsion of the organic silver salt can be prepared in a similar manner to that in the preparation of the silver halide emulsion.

In the preparation of the light-sensitive material, the polymerizable compound can be used as a medium for the preparation of a liquid composition containing other components of the light-sensitive layer. For example, the silver halide (including silver halide emulsion), reducing agent, color image-forming substance and the like can be dissolved or emulsified in the polymerizable compound. Especially when the color image-forming substance is used, the substance is preferably introduced into the polymerizable compound. Further, when the oily droplets of the polymerizable compound are made in the form of microcapsules, components of the shell material may be contained in the polymerizable compound.

A light-sensitive composition containing the polymerizable compound which contains the silver halide can be prepared using the silver halide emulsion. Otherwise, a silver halide powder prepared by lyophilization can be also employed other than the silver halide emulsion to prepare the light-sensitive composition. The light-sensitive composition can be obtained by stirring the polymerizable compound and the silver halide using a homogenizer, a blender, a mixer or other conventional stirring device.

A copolymer consisting of hydrophilic repeating unit and hydrophobic repeating unit is preferably dissolved in the polymerizable compound employed in the preparation of the light-sensitive composition, as described in Japanese Patent Provisional Publication No. 62(1987)-209449.

The light-sensitive composition can be also prepared by dispersing microcapsules containing silver halide emulsion as a core material in the polymerizable compound instead of employing the above copolymer, as described in Japanese Patent Provisional Publication No. 62(1987)-164041.

The polymerizable compound or the above-mentioned light-sensitive composition which further contains other components is preferably employed in the form of an emulsion in which the compound or the composition is emulsified in an aqueous medium. In the case of preparing microcapsules of oily droplets containing the polymerizable compound, it is possible that the shell material required for the preparation of microcapsules is added to the emulsion and the emulsion is then subjected to a process for forming a shell of microcapsule, as described in Japanese Patent Provisional Publication No. 61(1986)-275742. Otherwise, to the emulsion may be also added a reducing agent or other optional components.

Examples of the processes for preparing microcapsules (encapsulation processes) include a process utilizing coacervation of a hydrophilic shell material as described in U.S. Pat. Nos. 2,800,457 and 2,800,458; an interface polymerization process as described in U.S. Pat. No. 3,287,154, U.K. Patent No. 990,443, and Japanese Patent Publication Nos. 38(1963)-19574, 42(1967)-446 and 42(1967) 771; a polymer deposition process as described in U.S. Pat. Nos. 3,418,250 and 3,660,304; a process using an isocyanate-polyol shell material as described in U.S. Pat. No. 3,796,669; a process using an isocyanate shell as described in U.S. Pat. No. 3,914,511; a process using an urea-formaldehyde or urea-formaldehyde-resorcinol shell material as described in U.S. Pat. Nos. 4,001,140, 4,087,376 and 4,089,802; a process using a shell material such as melamine-formaldehyde resin or hydroxypropyl cellulose as described in U.S. Pat. No. 4,025,455; an in-situ process utilizing polymerization of monomers as described in Japanese Patent Publication No. 36(1961)-9168 and Japanese Patent Provisional Publication No. 51(1976)-9079; a polymerization-dispersion cooling process as described in U.K. Patent Nos. 927,807 and 965,074; and a spray-drying process as described in U.S. Pat. No. 3,111,407 and U.K. Patent No. 930,422. The process for encapsulation of oily droplets of the polymerizable compound is by no means restricted to the above-mentioned processes, but most preferred is a process comprising emulsifying a core material and then forming a polymer film as a shell of the microcapsule around the core material.

According to the above-mentioned process, a microcapsule dispersion containing silver halide, reducing agent, polymerizable compound, etc. can be prepared, and the dispersion can be employed per se as a coating solution for preparing a light-sensitive material. Other optional components can be also added to the coating solution.

The coating solution prepared as above is coated over a support, and the coated layer of the solution is dried to prepare a light-sensitive material. Coating of the solution over the support can be readily performed by known processes.

The process for the preparation of the light-sensitive material of the first embodiment is described above, but the light-sensitive material of the second embodiment can be also prepared in the similar manner.

The examples of the present invention and the comparison examples are given below.

EXAMPLE 1

Preparation of image-receiving material

To 125 g of water was added 11 g of a 40 % aqueous solution of sodium hexametaphosphate, and were further added 34 g of 3,5-di-α-methylbenzylsalicylate and 82 g of a 55 % aqueous slurry of calcium carbonate, followed by coarsely dispersing in a mixer. The coarse dispersion was then finely dispersed in Dynomill dispersing device, to prepare a dispersion (Dispersion A).

To 200 g of the resulting dispersion were added 142 g of 8 % aqueous solution of polyvinyl alcohol (tradename: PVA.117, available from Kuraray Co., Ltd.) and 90 ml of water, and the resulting mixture was made uniform to prepare a coating solution for the formation of an image-receiving layer. The coating solution was evenly applied onto a paper (support) having a weight of 55 g/m$^2$ in an amount of 60 g/m$^2$, and the coated solution was dried to form an image-receiving layer on the support.

Independently, 1 ml of perfluoroalkylphosphate (fluorine compound, tradename: Surfluon S112, available from Asahi Glass Co., Ltd.) was homogeneously dissolved in water to give 100 ml of a solution. The obtained solution was evenly coated over the above-obtained image-receiving layer in an amount of 24.6 g/m$^2$ (solid content: 0.03 g/m$^2$), and the coated layer of the solution was dried at 100° C. to prepare an image-receiving material (A).

EXAMPLES 2-7

The procedures of Example 1 were repeated except for using each compound set forth in Table 1 as a fluorine compound in the same amount (solid content: 0.03 g/m²) as that of the fluorine compound used in Example 1, to prepare image-receiving materials (B)–(G).

EXAMPLE 8

The procedures of Example 1 were repeated except for adding 1.8 mg of the fluorine compound of Example 1 to the coating solution for the formation of an image-receiving layer and applying the obtained solution onto the support instead of coating the solution containing the fluorine compound on the image-receiving layer, to prepare an image-receiving material (H). In the image-receiving material (H), the fluorine compound was contained in the image-receiving layer in an amount of 0.1 g/m².

EXAMPLE 9

To 1,000 g of Dispersion A obtained in Example 1 was added 611 g of 8 % aqueous solution of polyvinyl alcohol (tradename: PVA.117, available from Kuraray Co., Ltd.) to give a mixture.

Independently, 348 g of calcium carbonate (tradename: PC700, available from Shiraishi Industry Co., Ltd.), 7.18 g of a 40 % aqueous solution of acrylic acid/maleic acid copolymer and 1,000 ml of water were mixed with each other, and the obtained mixture was stirred using Polytron dispersing device (PT10/35 type, produced by Kinematica Ltd.) at 2,000 r.p.m. for 20 minutes. The resulting dispersion containing calcium carbonate was mixed with the above-obtained mixture. To the resulting mixture was added a dispersion obtained by dispersing 14 g of zinc chloride in 125 g of 8 % aqueous solution of polyvinyl alcohol (tradename: PVA.117, available from Kuraray Co., Ltd.) at 10,000 r.p.m. for 3 minutes using a homogenizer, and were further added 253 g of 10 % aqueous solution of gelatin and 325 g of water, to prepare a coating solution for the formation of an image-receiving layer. The coating solution was coated over a paper (support) having a weight of 55 g/m² in an amount of 102 cc/m², and the coated solution was dried at 100° C. to prepare an image-receiving layer on the support.

Independently, 1 ml of perfluoroalkylphosphate (fluorine compound, tradename: Surfluon S112, available from Asahi Glass Co., Ltd.) was homogeneously dissolved in water to give 100 ml of a solution. The obtained solution was evenly coated over the above-obtained image-receiving layer in an amount of 24.6 g/m² (solid content: 0.03 g/m²), and the coated layer of the solution was dried at 100° C. to prepare an image-receiving material (I).

COMPARISON EXAMPLE 1

The procedures of Example 1 were repeated except for not coating the solution containing the fluorine compound on the image-receiving layer, to prepare an image-receiving material (X-1) for comparison.

COMPARISON EXAMPLE 2

The procedures of Example 9 were repeated except for not coating the solution containing the fluorine compound on the image-receiving layer, to prepare an image-receiving material (X-2) for comparison.

Preparation of Light-Sensitive Material (I)

Preparation of silver halide emulsion (A)

In 1,200 ml of water were dissolved 24 g of gelatin and 1.2 g of sodium chloride, and the resulting gelatin solution was adjusted to pH 3.2 using 1N-sulfuric acid and kept at 60° C. To the gelatin solution, 600 ml of an aqueous solution containing 117 g of potassium bromide and 600 ml of an aqueous solution containing 0.74 mole of silver nitrate were added simultaneously at the same feed rate over a period of 45 minutes. After 5 minutes, to the resulting solution was further added 200 ml of an aqueous solution containing 4.3 g of potassium iodide at a fixed feed rate over a period of 5 minutes to give an emulsion. To the emulsion was then added 1.2 g of isobutylene/monosodiun maleate copolymer.

After the emulsion was washed for desalting, 24 g of gelatin was added to the emulsion. Further, to the resulting emulsion were added 5 mg of sodium thiosulfate and 0.5 g of the following sensitizing dye (a) to chemically sensitize the emulsion at 60° C. for 15 minutes. Thus, a silver halide emulsion (A) (blue-sensitive, yield: 1,000 g) was obtained.

(Sensitizing dye (a))

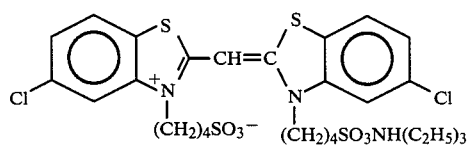

Preparation of silver halide emulsion (B)

In 1,200 ml of water were dissolved 24 g of gelatin and 1.2 g of sodium chloride, and the resulting gelatin solution was adjusted to pH 3.2 using 1N-sulfuric acid and kept at 60° C. To the gelatin solution, 600 ml of an aqueous solution containing 117 g of potassium bromide and 600 ml of an aqueous solution containing 0.74 mole of silver nitrate were added simultaneously at the same feed rate over a period of 45 minutes. After 5 minutes, to the resulting solution was further added 200 ml of an aqueous solution containing 4.3 g of potassium iodide at a fixed feed rate over a period of 5 minutes to give an emulsion. To the emulsion was then added 1.2 g of isobutylene/monosodium maleate copolymer.

After the emulsion was washed for desalting, 24 g of gelatin was added to the emulsion. Further, to the resulting emulsion were added 5 mg of sodium thiosulfate and 0.47 g of the following sensitizing dye (b) to chemically sensitize the emulsion at 60° C. for 15 minutes. Thus, a silver halide emulsion (B) (green-sensitive, yield: 1,000 g) was obtained.

(Sensitizing dye (b))

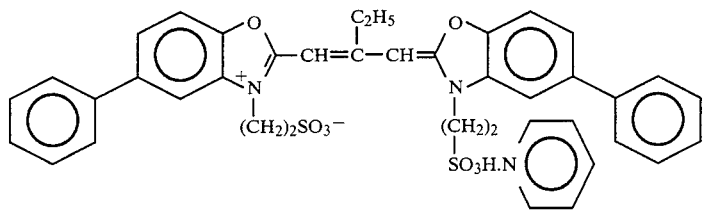

Preparation of silver halide emulsion (C)

In 1,200 ml of water were dissolved 24 g of gelatin and 1.2 g of sodium chloride, and the resulting gelatin solution was adjusted to pH 3.2 using 1N-sulfuric acid and kept at 60° C. To the gelatin solution, 600 ml of an aqueous solution containing 117 g of potassium bromide and 600 ml of an aqueous solution containing 0.74 mole of silver nitrate were added simultaneously at the same feed rate over a period of 45 minutes. After 5 minutes, to the resulting solution was further added 200 ml of an aqueous solution containing 4.3 g of potassium iodide at a fixed feed rate over a period of 5 minutes to give an emulsion. To the emulsion was then added 1.2 g of isobutylene/monosodium maleate copolymer.

After the emulsion was washed for desalting, 24 g of gelatin was added to the emulsion. Further, to the resulting emulsion were added 5 mg of sodium thiosulfate and 0.47 g of the following sensitizing dye (c) to chemically sensitize the emulsion at 60° C. for 15 minutes. Thus, a silver halide emulsion (C) (red-sensitive, yield: 1,000 g) was obtained.

(Sensitizing dye (c))

-continued

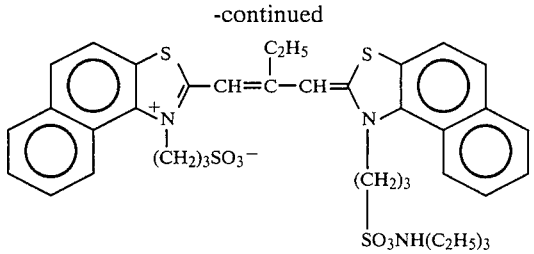

Preparation of light-sensitive composition (A)

In 83 g of the following polymerizable compound were dissolved 0.77 g of the following copolymer and 12.5 g of the following color image-forming substance (a). In the resulting solution were dissolved 6.4 g of the following hydrazine compound, 6.1 g of the following reducing agent, 0.09 of the following development inhibitor-releasing precursor, 0.01 g of the following anti-fogging agent, 1.8 g of the following surface active agent and 20 g of methylene chloride, to prepare an oily solution. To the oily solution were added 15 g of the above-obtained silver halide emulsion (A) and 1.5 ml of 10 % aqueous solution of potassium bromide, and the resulting mixture was stirred for 5 minutes. Further, to the mixture was added 1.5 ml of 1 % aqueous solution of polyvinyl pyrrolidone (K-15), and the mixture was stirred for 5 minutes. Then the mixture containing the silver halide emulsion was stirred at 15,000 r.p.m. for 5 minutes at 40 ©C using a homogenizer, to obtain a light-sensitive (blue-sensitive) composition (A).

(polymerizable compound)

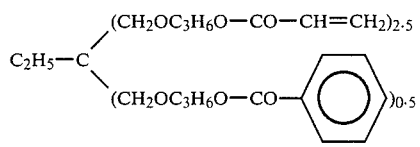

(Color image-forming substance (a))

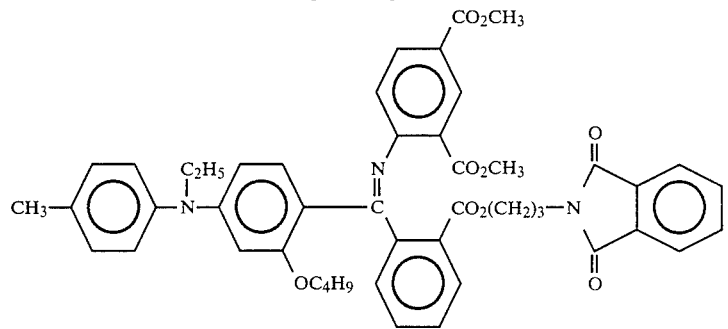

(Copolymer)

-continued

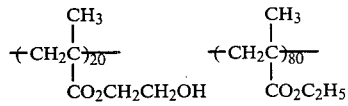

(Hydrazine compound)

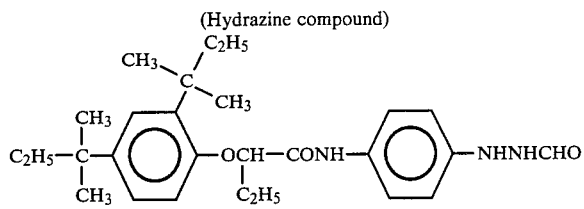

(Reducing agent)

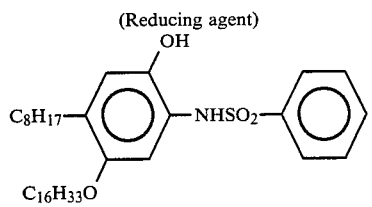

(Development inhibitor-releasing precursor)

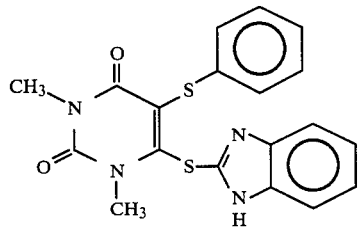

(Anti-fogging agent)

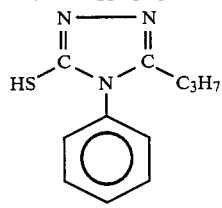

(Surface active agent)

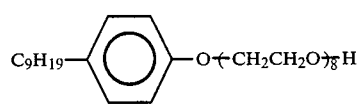

Preparation of light-sensitive composition (B)

The procedures for the preparation of the light-sensitive composition (A) were repeated except for using the aforementioned silver halide emulsion (B) instead of the silver halide emulsion (A) and using the following color image-forming substance (b) instead of the color image forming substance (a), to prepare a light-sensitive (green-sensitive) composition (B).

(Color image-forming substance (b))

-continued

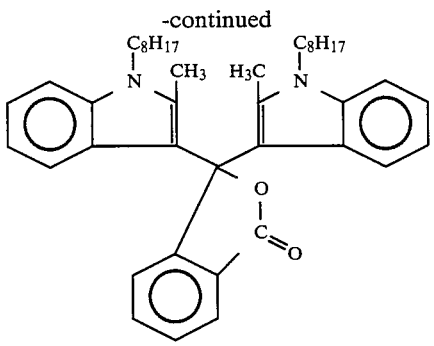

Preparation of light-sensitive composition (C)

The procedures for the preparation of the light-sensitive composition (A) were repeated except for using the aforementioned silver halide emulsion (C) instead of the silver halide emulsion (A) and using the following color image-forming substance (c) instead of the color image forming substance (a), to prepare a light-sensitive (red-sensitive) composition (C).

(Color image-forming substance (c))

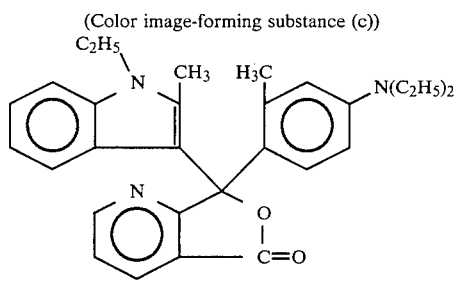

Preparation of light-sensitive microcapsule dispersion (A)

In the above-prepared light-sensitive composition (A) was dissolved 4.5 g of isocyanate compound (tradename: Takenate D110N, available from Takeda Chemical Industries, Ltd.). The resulting solution was added to 125 g of a 10 % aqueous solution of polymer (tradename: VERSA TL-502, available from National Starch Co., Ltd.) having pH value of 6.0, and the mixture was stirred at 9,000 r.p.m. for 30 minutes at 40° C. using a homogenizer to emulsify the light-sensitive composition (A) in the aqueous medium so as to prepare an aqueous emulsion.

Under stirring the aqueous emulsion at 1,200 r.p.m. at 25° C., to the emulsion was added 77 g of a melamine/formalin prepolymer (obtained by stirring a mixture of 186 g of water, 34.5 g of melamine and 57 g of formalin at 600 r.p.m. for 30 minutes at 60° C.) and adjusted to pH of 6.0. After stirring the resulting mixture at 1,200 r.p.m. for 90 minutes at 60° C., 27 g of a 40 % aqueous solution of urea was added to the mixture and adjusted to pH of 3.5. The resulting dispersion was stirred at 1,000 r.p.m. for 40 minutes at 60° C., and the dispersion was adjusted to pH value of 6.5. Thus, a light-sensitive (blue-sensitive) microcapsule dispersion (A) was obtained.

Preparation of light-sensitive microcapsule dispersion (B)

The above procedures for preparing the light-sensitive microcapsule dispersion (A) were repeated except for using the above-obtained light-sensitive composition (B) instead of the light-sensitive composition (A), to prepare a light-sensitive (green-sensitive) microcapsule dispersion (B).

Preparation of light-sensitive microcapsule dispersion (C)

The above procedures for preparing the light-sensitive microcapsule dispersion (A) were repeated except for using the above-obtained light-sensitive composition (C) instead of the light-sensitive composition (A), to prepare a light-sensitive (red-sensitive) microcapsule dispersion (C).

Preparation of base precursor dispersion

The following base precursor was dispersed in 80 g of a 4 % aqueous solution of polyvinyl alcohol (tradename: PVA205, available from Kuraray Co., Ltd.) using Dynomill dispersing device at 20° C. to make a mean particle size of the precursor of 2 μm. Thus, a base precursor dispersion was prepared.

(Base precursor)

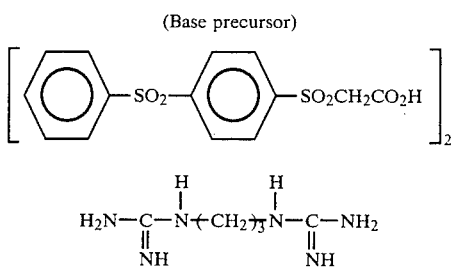

Preparation of paper support 20 parts by weight (weight of dry pulp) of LBSP and 80 parts by weight,(weight of dry pulp )of LBKP were beaten to give Canadian Freeness (CSF) of 290 cc using a refiner. To the resulting mixture were added 0.3 part by weight of alkylketone dimer (tradename: Aquapel 12, available from Dik Hercures Co., Ltd. neutral sizing agent), 0.5 part by weight of polyamide-polyamine epichlorohydrin (tradename: Kymene 557, available from Dik Hercures Co.,Ltd.,fixing agent ) and 0.5 part by weight of cation-modified polyacrylamide (tradename: Polystron 705, available from Arakawa Chemical Industry Ltd., paper-strength increasing agent). Then, the mixture was processed using a paper machine to prepare a paper sheet having a weight of 60 g/m$^2$ and a thickness of 66 μm.

On the surface (felt surface) of the paper sheet prepared as above were coated in order a coating solution for the formation of a moisture-resistant layer made of a polyvinylidene chloride resin and a coating solution for the formation of a moisture-resistant layer comprising 100 parts by weight of SBR latex (tradename: SN-304, available from Sumitomo Norgatac Co., Ltd.), 1 part by weight of sodium polyacrylate (tradename: Aron T40, available from Toagosei Chemical Industry Co.,Ltd.), 200 parts by weight of clay (tradename: UW.90, available from Engerherd Ltd.) and 100 parts by weight of petroleum resin (tradename: CarbomuleR, available from Dik Hercures Co.,.Ltd.), in amounts of 16 g/m$^2$ and 5 g/$^2$, respectively, using a knife coater, to prepare a paper support.

Preparation of light-sensitive material (I)

16 g of the light-sensitive microcapsule dispersion (A), 18.5 g of the light-sensitive microcapsule dispersion (B), 14.8 g of the light-sensitive microcapsule dispersion (C), 6.8 g of the base precursor dispersion, 9 ml of a 20 % aqueous sorbitol solution and 10 ml of a 10 % aqueous solution of starch (tradename: KF-5, available from Shinshin Food Industry Ltd.) were mixed with each other. To the obtained aqueous mixture was added 4 ml of a 5 % aqueous solution of the aforementioned surface active agent to give 174 g of a coating solution.

The coating solution was coated over the above-obtained paper support in an amount of 50 g/m$^2$, and the coated solution was dried at approx. 60° C. to prepare a light-sensitive material (I).

Image Formation and Evaluation Thereof

Am image-forming method was performed using each of the above-obtained image-receiving materials (A) to (I), (X-1) and (X-2), and the above-obtained light-sensitive material (I), and the method was evaluated on the peeling properties of the image-receiving material from the light-sensitive material and the transferred image according to the following tests.

(1) Evaluation on peeling properties

The image-receiving material was superposed on the light-sensitive material under the conditions of a high temperature and a high humidity (30° C. and 80 %RH), and they were passed through press rolls under a pressure of 700 kg/cm². Then, the image-receiving material was peeled off the light-sensitive material, and the force required for peeling the image-receiving material from the light-sensitive material (peeling force: g/26 cm-width) was measured using a spring scale.

(2) Evaluation on transferred image

The light-sensitive material was exposed to light using a tungsten lamp at 2,000 lux for 1 second through a filter having continuous pattern of density variation, and then placed on a hot plate at 155° C. in such a manner that the light-sensitive layer is in close contact with the hot plate to perform heat development for 10 seconds. The light sensitive material was then superposed on the image-receiving material in the above-mentioned atmosphere, and they were passed through press rolls under a pressure of 700 kg/cm². Thereafter, the image receiving material was peeled off the light-sensitive material, to obtain a full-color positive image on the image-receiving material. The density (maximum density, green color) of the obtained image was measured using a Macbeth reflection densitometer.

The results are set forth in Table 1, in which the numerals in "Compound Name" correspond to the numerals of the aforementioned fluorine compounds (1) to (81).

TABLE 1

| Image-receiving Material | Fluorine Compound Compound Name | Position | Peeling Force (g/26 cm) | Maximum Density |
|---|---|---|---|---|
| (A) | Surfluon S112 | surface | 30 | 1.30 |
| (B) | (12) | surface | 40 | 1.30 |
| (C) | Dyefree | surface | 120 | 1.29 |
| (D) | (24) | surface | 80 | 1.25 |
| (E) | (34) | surface | 90 | 1.27 |
| (F) | (51) | surface | 70 | 1.23 |
| (G) | (37) | surface | 100 | 1.24 |
| (H) | Surfluon S112 | inside | 120 | 1.30 |
| (I) | Surfluon S112 | surface | 110 | 1.41 |
| (X-1) | — | — | 190 | 1.25 |
| (X-2) | — | — | unmeasurable | 1.38 |

As is evident from the results set forth in Table 1, in the case of conducting the image-forming method of the invention using each of the image-receiving materials (A) to (I) containing the fluorine compound, it was easy to separate the image-receiving material from the light-sensitive material, and the maximum density of the transferred image did not decrease. On the other hand, in the case of conducting the image-forming method using the image-receiving materials (X-1) and (X-2), each containing no fluorine compound, it is difficult to separate the image-receiving material from the light-sensitive material, and particularly in the case of using the image-receiving material (X-2), agglomeration breakage was observed.

EXAMPLE 10

Preparation of Light-Sensitive Material (II)

Preparation of light-sensitive composition

In 37.5 g of the following polymerizable compound (tradename: Kayarad R604, available from Nippon Kayaku Co., Ltd.) were dissolved 3.0 g of a photopolymerization initiator (tradename: Ilgacure 651, available from Ciba-Geigy) and 7.5 g of the following magenta image-forming substance, to prepare a light-sensitive composition.

(Polymerizable compound)

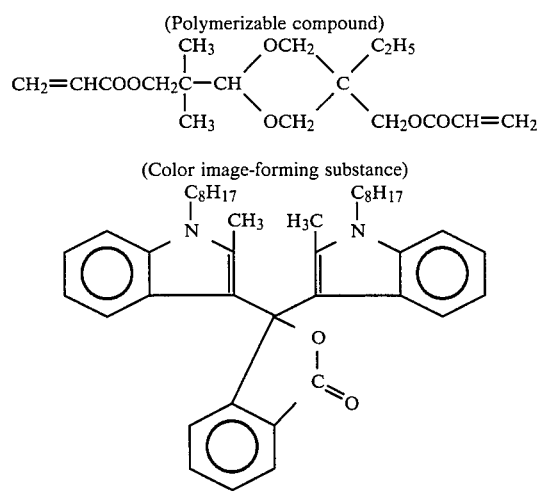

(Color image-forming substance)

Preparation of light-sensitive microcapsule dispersion 5.6 g of a 15 % aqueous solution of polyvinylbenzene potassium sulfinate was mixed with 134.5 g of a 5.1 % aqueous solution of polyvinyl pyrrolidone (tradename: K-90, available from Wako Junyaku Industry Ltd.), and the resulting mixture was adjusted to pH 5.0. To the mixture was added the above-obtained light-sensitive composition, and the mixture was stirred for 30 minutes at 3,000 r.p.m. at 50° C. using a dissolver, to prepare an O/W emulsion.

Independently, to 14.8 g of melamine were added 20.0 g of 37 % aqueous solution of formaldehyde and 76.3 g of distilled water, and the resulting mixture was stirred at 60° C. for 40 minutes to obtain a transparent aqueous solution of melamine-formaldehyde precondensate.

40.0 g of the aqueous solution of the precondensate and 8.0 g of water were added to the above-prepared O/W emulsion, and the resulting mixture was adjusted to pH 5.0 using a 10 % aqueous phosphoric acid solution. The mixture was then heated to 60° C. and stirred for 60 minutes. To the mixture was further added 11 g of a 40 % aqueous urea solution and stirred for 40 minutes at 60° C. Thereafter, the mixture was adjusted to pH 6.5 using a 10 % aqueous sodium hydroxide solution, to obtain a light-sensitive microcapsule dispersion containing microcapsules of melamine-formaldehyde resin shell.

Preparation of light-sensitive material (II)

To 35.5 g of the above-obtained light-sensitive microcapsule dispersion were added 4 ml of a 5 % aqueous solution of the following surface active agent and 10 ml of a 10 % aqueous solution of polyvinyl alcohol (tradename: PVA-205, available from Kuraray Co., Ltd.), and to the resulting mixture was further added water to prepare 74 g of a coating solution.

The coating solution was coated over polyethylene terephthalate (support) having a thickness of 100 μm in an amount of 57 g/m², and the coated solution was dried at approx. 60° C. to prepare a light-sensitive material (II).

(Surface active agent)

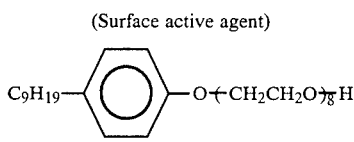

Image Formation and Evaluation Thereof

Am image-forming method was performed using each of the above-obtained image-receiving materials (A) to (I), (X-1) and (X-2), and the above-obtained light-sensitive material (II), and the method was evaluated on the peeling properties of the image-receiving material from the light-sensitive material and the transferred image according to the following tests.

(1) Evaluation on peeling properties

The image-receiving material was superposed on the light-sensitive material under the conditions of a high temperature and a high humidity (30° C., 80 %RH), and they were passed through press rolls under a pressure of 700 kg/cm². Then, the image-receiving material was peeled off the light-sensitive material, and the force required for peeling the image-receiving material from the light-sensitive material (peeling force: g/26 cm.width) was measured using a spring scale.

(2) Evaluation on transferred image

The light-sensitive material was imagewise exposed to light at a distance of 30 cm using a high-pressure mercury lamp of 200 W for 2 seconds.

The light-sensitive material was then superposed on the image-receiving material in the above-mentioned atmosphere, and they were passed through press rolls under a pressure of 700 kg/cm². Thereafter, the image-receiving material was separated from the light-sensitive material, to obtain a positive image on the image-receiving material. The density (maximum density) of the obtained image was measured using a Macbeth reflection densitometer.

The results are set forth in Table 2, in which the numerals in "Compound Name" corresponding to the numerals of the aforementioned fluorine compounds (1) to (81).

TABLE 2

| Image-receiving Material | Fluorine Compound Compound Name | Position | Peeling Force (g/26 cm) | Maximum Density |
|---|---|---|---|---|
| (A) | Surfluon S112 | surface | 30 | 1.19 |
| (B) | (12) | surface | 40 | 1.22 |
| (C) | Dyefree | surface | 110 | 1.23 |
| (D) | (24) | surface | 80 | 1.20 |
| (E) | (34) | surface | 80 | 1.21 |
| (F) | (51) | surface | 70 | 1.18 |
| (G) | (37) | surface | 100 | 1.17 |
| (H) | Surfluon S112 | inside | 110 | 1.30 |
| (I) | Surfluon S112 | surface | 100 | 1.37 |
| (X-1) | — | — | 180 | 1.20 |
| (X-2) | — | — | unmeasurable | 1.35 |

As is evident from the results set forth in Table 2, in the case of conducting the image-forming method of the invention using each of the image-receiving materials (A) to (I) containing the fluorine compound, it was easy to peel off the image-receiving material from the light-sensitive material, and the maximum density of the transferred image did not decrease. On the other hand, in the case of conducting the image-forming method using the image-receiving materials (X-1) and (X-2), each containing no fluorine compound, it is difficult to separate the image-receiving material from the light-sensitive material, and particularly in the case of using the image-receiving material (X-2), agglomeration breakage was observed.

I claim:

1. An image-forming method which comprises the steps of:

imagewise exposing to light a light-sensitive material comprising a support and a light-sensitive layer provided thereon which contains silver halide, a reducing agent and an ethylenically unsaturated polymerizable compound, at least said silver halide and said polymerizable compound being contained in a microcapsule;

simultaneously or thereafter heat-developing the light-sensitive material; and pressing the light-sensitive material on an image-receiving material comprising a support and a porous image-receiving layer which contains a fluorine atom-containing compound to transfer the unpolymerized polymerizable compound to the image-receiving material, said porous image-receiving layer being formed by introducing pigment particles into the image-receiving layer in an amount of 0.1 to 60 g/m².

2. The image-forming method as claimed in claim 1, wherein the fluorine atom-containing compound is a fluorine-containing surface active agent.

3. The image-forming method as claimed in claim 1, wherein the fluorine atom-containing compound is a fluorine-containing surface active agent having a surface tension of not less than 25 dyne/cm.

4. The image-forming method as claimed in claim 1, the fluorine atom-containing compound exists on the surface side of the image-receiving layer.

5. The image-forming method as claimed in claim 1, the fluorine atom-containing compound is contained in the image-receiving layer in an amount of 0.01 to 1 g/m².

6. The image-forming method as claimed in claim 1, wherein the image-receiving layer contains a developer and the developer is a zinc salt of a salicylic acid derivative.

7. The image-forming method as claimed in claim 1, wherein the light-sensitive layer further contains a color image-forming substance and the color image-forming substance is contained in a microcapsule.

8. The image-forming method as claimed in claim 1, wherein the pigment particles are selected from titanium dioxide, zinc oxide, barium oxide, calcium carbonate, aluminum silicate and zirconium oxide.

9. The image-forming method as claimed in claim 1, wherein the pigment particles have a particle size in the range of 0.1 to 50 μm.

10. An image-forming method which comprises the steps of:

imagewise exposing to light a light-sensitive material comprising a support and a light-sensitive layer provided thereon which contains a photopolymerizable composition or a photopolymerizable compound, said photopolymerizable composition or said photopolymerizable compound being contained in a microcapsule; and pressing the light-sensitive material on an image-receiving material comprising a support and a porous image-receiving layer which contains a fluorine atom-containing compound to transfer the unpolymerized photopolymerizable composition or the unpolymerized photopolymerizable compound to the image-receiving material, said porous image-receiving layer being formed by introducing pigment particles into the image-receiving layer in an amount of 0.1 to 60 g/m$^2$.

11. The image-forming method as claimed in claim 10, wherein the fluorine atom-containing compound is a fluorine-containing surface active agent.

12. The image-forming method as claimed in claim 10, wherein the fluorine atom-containing compound is a fluorine-containing surface active agent having a surface tension of not less than 25 dyne/cm.

13. The image forming method as claimed in claim 10, the fluorine atom-containing compound exists on the surface side of the image-receiving layer.

14. The image-forming method as claimed in claim 10, the fluorine atom-containing compound is contained in the image-receiving layer in an amount of 0.01 to 1 g/m$^2$.

15. The image forming method as claimed in claim 10, wherein the image-receiving layer contains a developer and the developer is a zinc salt of a salicylic acid derivative.

16. The image-forming method as claimed in claim 10, wherein the light-sensitive layer further contains a color image-forming substance and the color image-forming substance is contained in a microcapsule.

17. The image-forming method as claimed in claim 10, wherein the pigment particles are selected from titanium dioxide, zinc oxide, barium oxide, calcium carbonate, aluminum silicate and zirconium oxide.

18. The image-forming method as claimed in claim 10, wherein the pigment particles have a particle size in the range of 0.1 to 50 μm.

* * * * *